United States Patent
Hyatt et al.

(10) Patent No.: US 7,336,065 B1
(45) Date of Patent: Feb. 26, 2008

(54) ENERGY DEVICE WITH AN EXTENDED DYNAMIC RANGE ON CURRENT READINGS

(75) Inventors: Geoffrey T. Hyatt, Victoria (CA); Stewart J. Harding, Victoria (CA); Bernard C. Mansey, Malahat (CA)

(73) Assignee: Power Measurement Ltd., Saanichton, B.C. (CA)

( * ) Notice: Subject to any disclaimer, the term of this patent is extended or adjusted under 35 U.S.C. 154(b) by 0 days.

(21) Appl. No.: 10/341,079

(22) Filed: Jan. 13, 2003

Related U.S. Application Data

(60) Provisional application No. 60/439,417, filed on Jan. 10, 2003.

(51) Int. Cl.
G01R 7/00 (2006.01)
G01R 11/32 (2006.01)

(52) U.S. Cl. ............... 324/142; 324/115; 324/158.1

(58) Field of Classification Search .............. None
See application file for complete search history.

(56) References Cited

U.S. PATENT DOCUMENTS

| | | | |
|---|---|---|---|
| 4,630,218 A * | 12/1986 | Hurley | ............ 702/64 |
| 4,644,320 A | 2/1987 | Carr et al. | |
| 4,788,494 A | 11/1988 | Faulkner | |
| 4,837,504 A | 6/1989 | Baer et al. | |
| 4,884,021 A * | 11/1989 | Hammond et al. | ......... 324/142 |
| 4,931,725 A | 6/1990 | Hutt et al. | |
| 4,959,573 A * | 9/1990 | Roberts | ............ 310/68 R |
| 4,992,725 A | 2/1991 | Komatsu et al. | |
| 5,061,890 A | 10/1991 | Longini | |
| 5,122,735 A | 6/1992 | Porter et al. | |
| 5,311,117 A | 5/1994 | Komatsu et al. | |
| 5,325,051 A * | 6/1994 | Germer et al. | ............ 324/142 |
| 5,391,983 A | 2/1995 | Lusignan et al. | |
| 5,502,374 A | 3/1996 | Cota | |
| 5,517,106 A | 5/1996 | Longini | |

(Continued)

OTHER PUBLICATIONS

"Class 0.5 Meters" PM390 & PM305 Multifunction Meters by Northern Design (Electronics) Ltd. England (four pages).*

(Continued)

*Primary Examiner*—Paresh Patel
(74) *Attorney, Agent, or Firm*—Brinks Hofer Gilson & Lione

(57) ABSTRACT

Systems and methods are disclosed for accurately measuring delivered or supplied electrical energy over an extended range of values. In one embodiment, a meter for monitoring the energy at a remote site includes a current sensor for measuring the current supplied to or from the site, and a microprocessor that generates output readings with an enhanced accuracy over a wide range of outputs in response to digital samples received from the sensor. In a one implementation, the meter is configured to provide readings with an accuracy that satisfies the standards IEC 60687 1A 0.5S, IEC 60687 5A 0.5S, ANSI C12.20 Class 20 0.5, and ANSI C12.20 Class 2/10 0.5. In another implementation, the meter is configured to provide readings with an accuracy that satisfies the standards IEC 60687 1A 0.2S, IEC 60687 5A 0.2S, ANSI C12.20 Class 20 0.2, and ANSI C12.20 Class 2/10 0.2.

41 Claims, 18 Drawing Sheets

U.S. PATENT DOCUMENTS

| | | | |
|---|---|---|---|
| 5,548,209 | A | 8/1996 | Lusingnan et al. |
| 5,572,438 | A | 11/1996 | Ehlers et al. |
| 5,594,331 | A | 1/1997 | White et al. |
| 5,617,020 | A | 4/1997 | Campbell et al. |
| 5,650,936 | A | 7/1997 | Loucks et al. |
| 5,715,390 | A * | 2/1998 | Hoffman et al. ............ 713/202 |
| 5,736,847 | A | 4/1998 | Van Doorn et al. |
| 5,742,512 | A * | 4/1998 | Edge et al. .................... 702/57 |
| 5,907,241 | A * | 5/1999 | Shuey et al. ................ 324/142 |
| 6,377,037 | B1 | 4/2002 | Burns et al. |
| 6,397,155 | B1 | 5/2002 | Przydatek et al. |
| 6,493,644 | B1 | 12/2002 | Jonker et al. |
| 6,519,509 | B1 | 2/2003 | Nierlich et al. |
| 6,538,577 | B1 * | 3/2003 | Ehrke et al. ........... 340/870.02 |
| 6,844,799 | B2 * | 1/2005 | Attarian et al. ............... 335/18 |
| 6,906,507 | B2 * | 6/2005 | Briese et al. ................ 324/142 |
| 2004/0113810 | A1 * | 6/2004 | Mason et al. .......... 340/870.02 |

OTHER PUBLICATIONS

"Energy Meters" U3039 by Gossen-Metrawatt GMBH, Germany (ten pages).*

"Static (Electronic) Three Phase Energy Meters Accuracy Class 0.2 and 0.5" by Ceylon Electricity Board, SRI Lanka, 1998 (Seventeen Pages).*

"Modern measurement techniques for verifying electricity meters and measuring loads on site" Dr. Ebel—MTE Meter Testing Equipment Corporation, Switzerland, 1997 (four pages).*

"ION 8300 8400 8500 Intelligent revenue meter" by Power Measurement, Oct. 2001, total eight pages.*

"ANSI C12.1-1995, American National Standard for Electric Meters—Code for Electricity Metering," National Electrical Manufacturing Association, front covers & pp. i-iii, 1-90 (1995).

"ANSI C12.10-1997, American National Standard for Watthour Meters" (Revision of ANSI C12.10-1987), National Electrical Manufacturing Association, front covers & pp. i-iv, 1-30 (1997).

"ANSI C12.16-1991, American National Standard for Solid-State Electricity Meters," Institute of Electrical and Electronics Engineers, Inc., pp. 1-29 (1991).

"ANSI C12.20-1998, American National Standard for Electricity Meters 0.2 and 0.5 Accuracy Classes," National Electrical Manufacturing Association, front covers & pp. i-iv, 1-22 (1998).

"IEC 687, International Standard, Alternating current static watt-hour meters for active energy (classes 0,2 S and 0.5 S)," International Electrotechnical Commission, pp. 1-42 (Second ed, 1992).

"IEC 61036, International Standard, Alternating current static watt-hour meters for active energy (classes 1 and 2)," International Electrotechnical Commission, front and back covers, pp. 1-105 (Edition 2.1, 2000).

"IEC 1268, International Standard, Alternating current static var-hour meters for reactive energy (classes 2 and 3)," International Electrotechnical Commission, front & back covers, pp. 1-85 (1995).

"8400 ION, 8500 ION Advanced Socket-Mount Meter," datasheet, Power Measurement, pp. 1-8 (Nov. 30, 2000).

"A3 Alpha Meter," datasheet, ABB Electricity Metering, pp. 1-2 (Jul. 2000).

\* cited by examiner

| In (I nominal) = | 10 Amp | | | | |
|---|---|---|---|---|---|
| Power Factor Unity | | | | | |
| | Class 0.5 | Class 0.2 | | Class 0.5 Starting Current 10mA | |
| 0.15A | 1.00% | 0.40% | | Class 0.2 Starting Current 10mA | |
| 0.25A | 0.50% | 0.20% | | | |
| 0.50A | 0.50% | 0.20% | | | |
| 1.50A | 0.50% | 0.20% | | | |
| 2.50A | 0.50% | 0.20% | | | |
| 5.00A | 0.50% | 0.20% | | | |
| 7.50A | 0.50% | 0.20% | | | |
| 10.00A | 0.50% | 0.20% | | | |
| | | | | | |
| Power Factor Leading 0.866 | | | Power Factor Lagging 0.5 | | |
| | Class 0.5 | Class 0.2 | | Class 0.5 | Class 0.2 |
| 0.50A | 1.00% | 0.50% | 1.00A | 1.00% | 0.50% |
| 2.50A | 0.60% | 0.30% | 2.50A | 0.60% | 0.30% |
| 5.00A | 0.60% | 0.30% | 5.00A | 0.60% | 0.30% |
| 10.00A | 0.60% | 0.30% | 10.00A | 0.60% | 0.30% |

| In (I nominal) = | 20 Amp | | | |
|---|---|---|---|---|
| Power Factor Unity | | | | |
| | Class 0.5 | Class 0.2 | | |
| 0.15A | 1.00% | 0.40% | Class 0.5 Starting Current 10mA | |
| 0.25A | 0.50% | 0.20% | Class 0.2 Starting Current 10mA | |
| 0.50A | 0.50% | 0.20% | | |
| 1.50A | 0.50% | 0.20% | | |
| 2.50A | 0.50% | 0.20% | | |
| 5.00A | 0.50% | 0.20% | | |
| 10.00A | 0.50% | 0.20% | | |
| 15.00A | 0.50% | 0.20% | | |
| 18.00A | 0.50% | 0.20% | | |
| 20.00A | 0.50% | 0.20% | | |

| Power Factor Leading 0.866 | | | Power Factor Lagging 0.5 | | |
|---|---|---|---|---|---|
| | Class 0.5 | Class 0.2 | | Class 0.5 | Class 0.2 |
| 0.50A | 1.00% | 0.50% | 1.00A | 1.00% | 0.50% |
| 2.50A | 0.60% | 0.30% | 2.50A | 0.60% | 0.30% |
| 10.00A | 0.60% | 0.30% | 10.00A | 0.60% | 0.30% |
| 20.00A | 0.60% | 0.30% | 20.00A | 0.60% | 0.30% |

```
In (I nominal) =        1 Amp
Power Factor Unity
         Class 0.5   Class 0.2              Class 0.5 Starting Current 1mA
   0.01A  1.00%      0.40%                  Class 0.2 Starting Current 1mA
   0.05A  1.00%      0.40%
   0.05A  0.50%      0.20%
   1.20A  0.50%      0.20%

Power Factor Leading 0.866                  Power Factor Lagging 0.5
         Class 0.5   Class 0.2                       Class 0.5   Class 0.2
   0.02A  1.00%      0.50%                  0.02A    1.00%       0.50%
   0.10A  1.00%      0.50%                  0.10A    1.00%       0.50%
   0.10A  0.60%      0.30%                  0.10A    0.60%       0.30%
   1.20A  0.60%      0.30%                  1.20A    0.60%       0.30%
```

| In (I nominal) | 2 Amp | | | |
|---|---|---|---|---|
| Power Factor Unity | | | | |
| | Class 0.5 | Class 0.2 | Class 0.5 Starting Current 2mA | |
| 0.02A | 1.00% | 0.40% | Class 0.2 Starting Current 2mA | |
| 0.10A | 1.00% | 0.40% | | |
| 0.10A | 0.50% | 0.20% | | |
| 2.40A | 0.50% | 0.20% | | |
| Power Factor Leading 0.866 | | | Power Factor Lagging 0.5 | |
| | Class 0.5 | Class 0.2 | Class 0.5 | Class 0.2 |
| 0.04A | 1.00% | 0.50% | 0.04A  1.00% | 0.50% |
| 0.20A | 1.00% | 0.50% | 0.20A  1.00% | 0.50% |
| 0.20A | 0.60% | 0.30% | 0.20A  0.60% | 0.30% |
| 2.40A | 0.60% | 0.30% | 2.40A  0.60% | 0.30% |

```
In (I nominal) =        5 Amp
Power Factor Unity
            Class 0.5    Class 0.2          Class 0.5 Starting Current 5mA
    0.05A   1.00%        0.40%              Class 0.2 Starting Current 5mA
    0.25A   1.00%        0.40%
    0.25A   0.50%        0.20%
    6.00A   0.50%        0.20%

Power Factor Leading 0.866                  Power Factor Lagging 0.5
            Class 0.5    Class 0.2                     Class 0.5    Class 0.2
    0.10A   1.00%        0.50%              0.10A     1.00%        0.50%
    0.50A   1.00%        0.50%              0.50A     1.00%        0.50%
    0.50A   0.60%        0.30%              0.50A     0.60%        0.30%
    6.00A   0.60%        0.30%              6.00A     0.60%        0.30%
```

| Power Factor Unity Class 0.2 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.001A | | | Starting A | | | Start Reading |
| 0.002A | | | | Starting A | | |
| 0.005A | | | | | Starting A | |
| 0.01A | Starting A | Starting A | 0.40% | | | 0.40% |
| 0.02A | | | 0.40% | 0.40% | | 0.40% |
| 0.05A | | | 0.40% | 0.40% | | 0.40% |
| 0.05A | | | 0.20% | 0.40% | 0.40% | 0.20% |
| 0.10A | | | 0.20% | 0.40% | 0.40% | 0.20% |
| 0.10A | | | 0.20% | 0.20% | 0.40% | 0.20% |
| 0.15A | 0.40% | 0.40% | 0.20% | 0.20% | 0.40% | 0.20% |
| 0.25A | 0.20% | 0.20% | 0.20% | 0.20% | 0.40% | 0.20% |
| 0.25A | 0.20% | 0.20% | 0.20% | 0.20% | 0.20% | 0.20% |
| 0.50A | 0.20% | 0.20% | 0.20% | 0.20% | 0.20% | 0.20% |
| 1.20A | 0.20% | 0.20% | 0.20% | 0.20% | 0.20% | 0.20% |
| 1.50A | 0.20% | 0.20% | | 0.20% | 0.20% | 0.20% |
| 2.40A | 0.20% | 0.20% | | 0.20% | 0.20% | 0.20% |
| 2.50A | 0.20% | 0.20% | | | 0.20% | 0.20% |
| 5.00A | 0.20% | 0.20% | | | 0.20% | 0.20% |
| 6.00A | 0.20% | 0.20% | | | 0.20% | 0.20% |
| 7.50A | 0.20% | 0.20% | | | | 0.20% |
| 10.00A | 0.20% | 0.20% | | | | 0.20% |
| 15.00A | | 0.20% | | | | 0.20% |
| 18.00A | | 0.20% | | | | 0.20% |
| 20.00A | | 0.20% | | | | 0.20% |

| Power Factor Leading 0.866 Class 0.2 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.02A | | | 0.50% | | | 0.50% |
| 0.04A | | | 0.50% | 0.50% | | 0.50% |
| 0.10A | | | 0.50% | 0.50% | 0.50% | 0.50% |
| 0.10A | | | 0.30% | 0.50% | 0.50% | 0.30% |
| 0.20A | | | 0.30% | 0.50% | 0.50% | 0.30% |
| 0.20A | | | 0.30% | 0.30% | 0.50% | 0.30% |
| 0.50A | 0.50% | 0.50% | 0.30% | 0.30% | 0.50% | 0.30% |
| 0.50A | 0.50% | 0.50% | 0.30% | 0.30% | 0.30% | 0.30% |
| 1.20A | | | 0.30% | 0.30% | 0.30% | 0.30% |
| 2.40A | | | | 0.30% | 0.30% | 0.30% |
| 2.50A | 0.30% | 0.30% | | | 0.30% | 0.30% |
| 5.00A | 0.30% | 0.30% | | | 0.30% | 0.30% |
| 6.00A | 0.30% | 0.30% | | | 0.30% | 0.30% |
| 10.00A | 0.30% | 0.30% | | | | 0.30% |
| 20.00A | | 0.30% | | | | 0.30% |

| Power Factor Lagging 0.5 Class 0.2 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.02A | | | 0.50% | | | 0.50% |
| 0.04A | | | 0.50% | 0.50% | | 0.50% |
| 0.10A | | | 0.50% | 0.50% | 0.50% | 0.50% |
| 0.10A | | | 0.30% | 0.50% | 0.50% | 0.30% |
| 0.20A | | | 0.30% | 0.50% | 0.50% | 0.30% |
| 0.20A | | | 0.30% | 0.30% | 0.50% | 0.30% |
| 0.50A | | | 0.30% | 0.30% | 0.50% | 0.30% |
| 0.50A | | | 0.30% | 0.30% | 0.30% | 0.30% |
| 1.00A | 0.50% | 0.50% | 0.30% | 0.30% | 0.30% | 0.30% |
| 1.20A | | | 0.30% | 0.30% | 0.30% | 0.30% |
| 2.40A | | | | 0.30% | 0.30% | 0.30% |
| 2.50A | 0.30% | 0.30% | | | 0.30% | 0.30% |
| 5.00A | 0.30% | 0.30% | | | 0.30% | 0.30% |
| 6.00A | 0.30% | 0.30% | | | 0.30% | 0.30% |
| 10.00A | 0.30% | 0.30% | | | | 0.30% |
| 20.00A | | 0.30% | | | | 0.30% |

| Power Factor Unity Class 0.5 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.001A | | | Starting A | | | Start Reading |
| 0.002A | | | | Starting A | | |
| 0.005A | | | | | Starting A | |
| 0.01A | Starting A | Starting A | 1.00% | | | 1.00% |
| 0.02A | | | | 1.00% | 1.00% | 1.00% |
| 0.05A | | | 1.00% | 1.00% | | 1.00% |
| 0.05A | | | 0.50% | 1.00% | 1.00% | 0.50% |
| 0.10A | | | 0.50% | 1.00% | 1.00% | 0.50% |
| 0.10A | | | 0.50% | 0.50% | 1.00% | 0.50% |
| 0.15A | 1.00% | 1.00% | 0.50% | 0.50% | 1.00% | 0.50% |
| 0.25A | 0.50% | 0.50% | 0.50% | 0.50% | 1.00% | 0.50% |
| 0.25A | 0.50% | 0.50% | 0.50% | 0.50% | 0.50% | 0.50% |
| 0.50A | 0.50% | 0.50% | 0.50% | 0.50% | 0.50% | 0.50% |
| 1.20A | 0.50% | 0.50% | 0.50% | 0.50% | 0.50% | 0.50% |
| 1.50A | 0.50% | 0.50% | | 0.50% | 0.50% | 0.50% |
| 2.40A | 0.50% | 0.50% | | 0.50% | 0.50% | 0.50% |
| 2.50A | 0.50% | 0.50% | | | 0.50% | 0.50% |
| 5.00A | 0.50% | 0.50% | | | 0.50% | 0.50% |
| 6.00A | 0.50% | 0.50% | | | 0.50% | 0.50% |
| 7.50A | 0.50% | 0.50% | | | | 0.50% |
| 10.00A | 0.50% | 0.50% | | | | 0.50% |
| 15.00A | | 0.50% | | | | 0.50% |
| 18.00A | | 0.50% | | | | 0.50% |
| 20.00A | | 0.50% | | | | 0.50% |

| Power Factor Leading 0.866 Class 0.5 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.02A | | | 1.00% | | | 1.00% |
| 0.04A | | | 1.00% | 1.00% | | 1.00% |
| 0.10A | | | 1.00% | 1.00% | 1.00% | 1.00% |
| 0.10A | | | 0.60% | 1.00% | 1.00% | 0.60% |
| 0.20A | | | 0.60% | 1.00% | 1.00% | 0.60% |
| 0.20A | | | 0.60% | 0.60% | 1.00% | 0.60% |
| 0.50A | 1.00% | 1.00% | 0.60% | 0.60% | 1.00% | 0.60% |
| 0.50A | 1.00% | 1.00% | 0.60% | 0.60% | 0.60% | 0.60% |
| 1.20A | | | 0.60% | 0.60% | 0.60% | 0.60% |
| 2.40A | | | | 0.60% | 0.60% | 0.60% |
| 2.50A | 0.60% | 0.60% | | | 0.60% | 0.60% |
| 5.00A | 0.60% | 0.60% | | | 0.60% | 0.60% |
| 6.00A | 0.60% | 0.60% | | | 0.60% | 0.60% |
| 10.00A | 0.60% | 0.60% | | | | 0.60% |
| 20.00A | | 0.60% | | | | 0.60% |

| Power Factor Lagging 0.5 Class 0.5 | | | | | | |
|---|---|---|---|---|---|---|
| | Accuracy Category 1 | Accuracy Category 2 | Accuracy Category 3 | Accuracy Category 4 | Accuracy Category 5 | Required Accuracy |
| 0.02A | | | 1.00% | | | 1.00% |
| 0.04A | | | 1.00% | 1.00% | | 1.00% |
| 0.10A | | | 1.00% | 1.00% | 1.00% | 1.00% |
| 0.10A | | | 0.60% | 1.00% | 1.00% | 0.60% |
| 0.20A | | | 0.60% | 1.00% | 1.00% | 0.60% |
| 0.20A | | | 0.60% | 0.60% | 1.00% | 0.60% |
| 0.50A | | | 0.60% | 0.60% | 1.00% | 0.60% |
| 0.50A | | | 0.60% | 0.60% | 0.60% | 0.60% |
| 1.00A | 1.00% | 1.00% | 0.60% | 0.60% | 0.60% | 0.60% |
| 1.20A | | | 0.60% | 0.60% | 0.60% | 0.60% |
| 2.40A | | | | 0.60% | 0.60% | 0.60% |
| 2.50A | 0.60% | 0.60% | | | 0.60% | 0.60% |
| 5.00A | 0.60% | 0.60% | | | 0.60% | 0.60% |
| 6.00A | 0.60% | 0.60% | | | 0.60% | 0.60% |
| 10.00A | 0.60% | 0.60% | | | | 0.60% |
| 20.00A | | 0.60% | | | | 0.60% |

ENERGY DEVICE WITH AN EXTENDED DYNAMIC RANGE ON CURRENT READINGS

RELATED APPLICATION

The present patent document claims the benefit of the filing date under 35 U.S.C. § 119(e) of Provisional U.S. Patent Application Ser. No. 60/439,417, filed Jan. 10, 2003, entitled "Energy Device With An Extended Dynamic Range On Current Readings", whose inventors were Geoffrey T. Hyatt, Stewart J. Harding and Bernard C. Mansey.

FIELD OF THE INVENTION

The present invention relates to a system for improving the accuracy range of measurement of electrical energy using metering devices.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

In a typical electrical distribution system, electrical energy is generated by an electrical supplier or utility company and distributed to consumers via a power distribution network. The power distribution network is the network of electrical distribution wires that link the electrical supplier to its consumers. Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to industrial users over a distributed power network that supplies power to various loads. Depending on the specific needs of the users, these loads can include, for example, various power machines, lights, HVAC units, and other types of equipment.

At the consumer's facility, there will typically be an electrical energy meter ("revenue meter") connected between the consumer and the power distribution network so as to measure the consumer's electrical demand. The revenue meter is an electrical energy measurement device that accurately measures the amount of electrical energy flowing to the consumer from the supplier. The amount of electrical energy measured by the meter is then used to determine the amount for which the energy supplier should be compensated. Typically power meters are designed and calibrated to cover circuit transformer specifications.

Cogeneration and independent power providers (IPP) applications have two modes of operation: In generation mode, a high amount of energy is flowing out of the facility. Typically 2 amps to 20 amps or more current generated at the secondary of the current transformers (CTs). When generation is turned off, those facilities behave as tiny loads, with as little as 0.010 amps to 0.015 amps being generated by the CTs. Measuring the bi-directional energy flow is usually done with two meters, one that will be able to measure accurately the high generation current but will not measure accurately in the low range, and one that will be accurate for the low load current, but will saturate in generation mode. Accordingly, there is a need to reduce the cost and complexity of installation hardware at these sites in addition to reducing the complexity of interpreting the energy readings from both meters.

SUMMARY

The scope of the present invention is defined by the following claims, and nothing in this section should be taken as a limitation on those claims. By way of introduction, the preferred embodiments described below relate to systems and methods for accurately measuring delivered or supplied electrical energy over an extended range of values.

One embodiment of an energy device, such as an electrical meter or an electrical relay, includes one or more sensors, an analog-to-digital (A/D) converter, a digital signal processor (DSP), a central processing unit (CPU), a memory, and a communication interface. The sensors are configured to measure one or more electrical parameters of an electrical circuit. In one embodiment of the energy device, the sensors include a voltage sensor and a current sensor that measure the electrical parameters of voltage and current in the electric circuit. The A/D converter is coupled to the sensors and configured to generate digital samples based on the outputs of the sensors. The DSP is coupled to the A/D converter, receives the digital samples, and generates an output signal in response to the digital samples. This output signal indicates the amount of power being supplied or drawn through the electrical circuit, or the amount of energy that has been supplied or drawn over a preceding interval of time through the electric circuit.

In one implementation, the energy device is configured to provide readings with an accuracy that satisfies the standards IEC 60687 (also known as "IEC 687") 1A 0.5S, IEC 60687 5A 0.5S, ANSI C12.20 Class 20 0.5, and ANSI C12.20 Class 10 0.5. In another implementation, the energy device is configured to provide readings with an accuracy that satisfies the standards IEC 60687 1A 0.2S, IEC 60687 5A 0.2S, ANSI C12.20 Class 20 0.2, and ANSI C12.20 Class 10 0.2. In yet another implementation, the energy device provides readings with an accuracy based on a customized selection of criteria that meet or exceed a combination of standardized criteria.

In one embodiment of the energy device, the A/D converter is coupled to the sensors through a number N of parallel pathways, each of which applies a different amount of amplification to the output of the sensors. The A/D converter provides N corresponding digital signals to the DSP. The A/D converter and the DSP then select a pathway with an appropriate amplification for the signal being received. By selecting the appropriate pathway, the DSP can generate an output that is neither clipped in magnitude nor compressed into the bottom end of the bit range for the digital signal.

The CPU connects the DSP to the communication interface. The output signal is provided to the communication interface through the CPU. The communication interface can be coupled to an external network or an output display for communicating the output. The CPU is also coupled to the memory, and can provide the output signal to the memory for temporary or long-term storage.

These and other embodiments of the energy device, and of methods and other systems for monitoring energy transmission, are described in more detail below with reference to the accompanying drawings.

BRIEF DESCRIPTION OF THE DRAWINGS

FIGS. 7a, 7b, 7c, and 7d are graphs and a chart showing the required accuracy to meet one embodiment of all four accuracy categories simultaneously.

DETAILED DESCRIPTION OF THE PRESENTLY PREFERRED EMBODIMENTS

Figure 1:
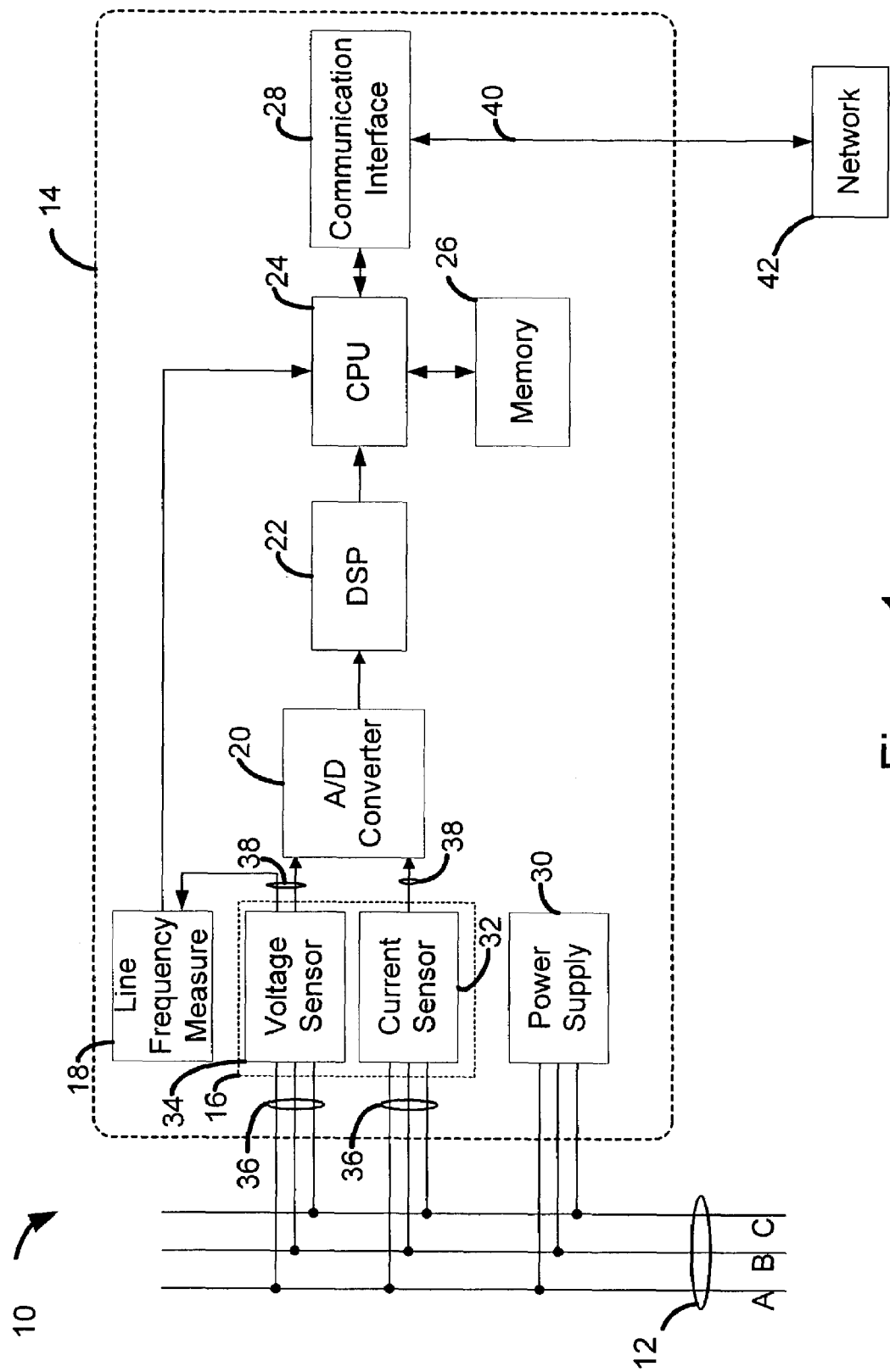
FIG. 1 is a block diagram of a portion of a power distribution system that includes one embodiment of an intelligent electronic device.

FIG. 1 is a block diagram showing a system for improving the accuracy range of measurement of electrical energy using metering devices. The diagram illustrates a portion of a power distribution system 10. The power distribution system 10 includes a plurality of conductors 12 and an intelligent electronic device (IED) 14. The conductors 12 are electrically coupled with the IED 14 as illustrated. Herein, the phrase "coupled with" is defined to mean directly connected to or indirectly connected through one or more intermediate components. Such intermediate components can include hardware based components, software based components, or combinations thereof. The conductors 12 may be, for example, electric transmission lines, electric distribution lines, power cables, bus duct or any other material capable of conducting electrical energy. The conductors 12 are operable to allow the flow of electrical energy there through. The conductors 12 are illustratively depicted in FIG. 1 in a three-phase circuit configuration; however the phase configuration is not limited to the three-phase configuration.

The IED 14 is one of a variety of power devices, such as a programmable logic controller (PLC), a remote terminal unit (RTU), an electronic power meter, a revenue meter, a protective relay, a fault recorder or other similar intelligent device capable of monitoring electrical energy. In addition, the IED 14 may perform other functions such as, for example, power distribution system protection, management of power generation, management of distribution and management of consumption. An exemplarily revenue meter is type 8500 manufactured by Power Measurement Ltd., located in Victoria, British Columbia, Canada. An energy device such as a revenue meter typically operates and measures within a current range that meets a single accuracy specification. In one embodiment, the IED 14 includes a plurality of metering sensors 16, a line frequency measurement circuit 18, an analog-to-digital (A/D) converter circuit 20, a digital signal processing (DSP) circuit 22, a central processing unit (CPU) 24, IED memory 26 and a communication interface 28 electrically connected as illustrated in FIG. 1 and as discussed below.

In addition, the IED 14 preferably includes a power supply 30 that is electrically connected with the conductors 12. The power supply 30 provides a source of power to energize the IED 14. In one embodiment, the power supply 30 uses the electrical energy flowing on the conductors 12 as an energy source. Alternatively, the power supply 30 can use other energy sources, such as, for example, an uninterruptible power source, batteries or some other source of power.

During operation of the power distribution system 10, the IED 14 monitors the electrical energy present in the conductors 12. The electrical energy is transformed by the metering sensors 16, which provide an output 38 to the IED 14. The sensors' output 38 can be used by the IED 14 to derive, store and display various electrical parameters indicative of the electrical energy present in the conductors 12. As illustrated in FIG. 1, the metering sensors 16 are mounted within a part of the IED 14. Alternatively, the metering sensors 16 can be separate devices mounted away from the IED 14, mounted on the IED 14, or a combination of both. The metering sensors 16 of the illustrated embodiment include a current sensor 32 and a voltage sensor 34.

During operation, the metering sensors 16 sense the electrical energy on the conductors 12 and output a corresponding electrical signal. In one embodiment, the electrical signal is an analog signal that is received by the A/D converter circuit 20. In an alternative embodiment, the metering sensors 16 provides an output in the form of a digital signal and the A/D converter circuit 20 is not required.

The A/D converter circuit 20 is implemented with any of a variety of circuits operable to convert analog signals to corresponding digital signals. During operation, the A/D converter circuit 20 receives the output 38 from the metering sensors 16. In one embodiment of the IED configuration, the output is received by the A/D converter circuit 20 in the form of analog signals and is converted to digital signals by any of a number of techniques. In another embodiment, the A/D converter circuit 20 also performs amplification and conditioning during conversion. The resulting digital signals are then passed to the DSP circuit 22.

The DSP circuit 22 performs signal processing and enhancement. The DSP circuit 22 is preferably used in conjunction with the A/D converter circuit 20 to enhance the quality of the digital signals. Enhancement can include, for example, noise removal, dynamic range and frequency response modification, or any other technique for enhancing digital signals. Following processing by the DSP circuit 22, the digital signals are provided to the CPU 24.

As further illustrated in FIG. 1, the IED 14 preferably includes a line frequency measurement circuit 18 that receives the output 38 from secondary windings of the voltage sensor 34. The line frequency measurement circuit 18 can be implemented by any of a variety of circuits that can measure the frequency of the output 38 provided by the voltage sensor 34. The output 38 can be used to determine the frequency of the primary voltage using frequency measurement techniques. The frequency, along with any other frequency related information is preferably converted to digital signals by the line frequency measurement circuit 18 and provided to the CPU 24. Alternatively, the line frequency measurement circuit 18 can be configured to provide analog signals to the CPU 24.

The CPU 24 can be implemented as a microprocessor, a control unit or any other of various devices capable of processing instruction sets. The CPU 24 receives and processes electrical signals representative of the electrical energy flowing on the conductors 12 to derive the electrical parameters. In the illustrated embodiment, the CPU 24 processes the digital signals provided by the line frequency measurement circuit 18 and the DSP circuit 22. The digital signals are used to derive electrical parameters related to the electrical energy present on the conductors 12, for example, the voltage, current, watts, vars, volt amps, power factor, frequency and others. In addition, electrical parameters relating to energy consumption such as, for example, kilowatt hours, kilovar hours, kilovolt amp hours and other time-based electrical parameters relating to the electrical energy can be additionally calculated by the CPU 24.

In a preferred embodiment, the IED conforms to five accuracy categories the device can conform to. The five accuracy categories, outlined below, are measurable within one device. Each accuracy category preferably defines a tolerance of accuracy for the IED over a specific current range. Each current range indicates a range of values for the detected current, and can be identified by a nominal current value in the range. The accuracy categories are also preferably specified for a variety of power factors, that is, a variety of relationships between the current and voltage in the conductors 12. The current and voltage can be in phase (unity power factor) or can have a relative phase shift (lagging or leading power factors). Under conditions of lagging and leading power factors, the accuracy categories are normally derated, reflecting the reduced accuracy that would be expected for energy measurement under such conditions.

In an alternate embodiment, the IED conforms to at least four accuracy categories. In yet another embodiment, the IED has an extended dynamic range greater than 66 db with no more than 0.5% error in energy accuracy at unity power factor for the entire db range. Another implementation of the IED has an extended dynamic range greater than 66 db with no more than 0.2% error in energy accuracy at unity power factor for the entire db range. Standards allow for different accuracy measures under different power factors. As outlined below, the accuracy standards are generally cited at a power factor of unity, lagging 0.5, and leading 0.866; however, it is appreciated by one skilled in the art, that measuring the power factor at a different level would alter the accuracy standards accordingly.

Accuracy class and accuracy categories define the allowable error in energy over a specified current range and power factor levels. Accuracy class indicates the allowable error in energy at unity power factor and at the nominal current. For example, an accuracy class 0.2 has 0.2% allowable error in energy at unity power factor, while accuracy class 1.0 has 1% allowable error. The accuracy category defines how the accuracy class is derated over a range of currents and at various power factors. Four common accuracy classes are 1.0, 0.5, 0.2, and 0.1. Each of these accuracy classes (as well as any less common accuracy class between 0 and 100) applies to each of the accuracy categories defined below. Typically, an accuracy class 0.1, 0.2, 0.5 or 1.0 energy device is specified at 0.1%, 0.2%, 0.5% or 1.0% allowable error in energy accuracy respectively through a range of current input; however, the accuracy is typically derated at lower current magnitudes and where the power factor is not unity.

Figure 2A:
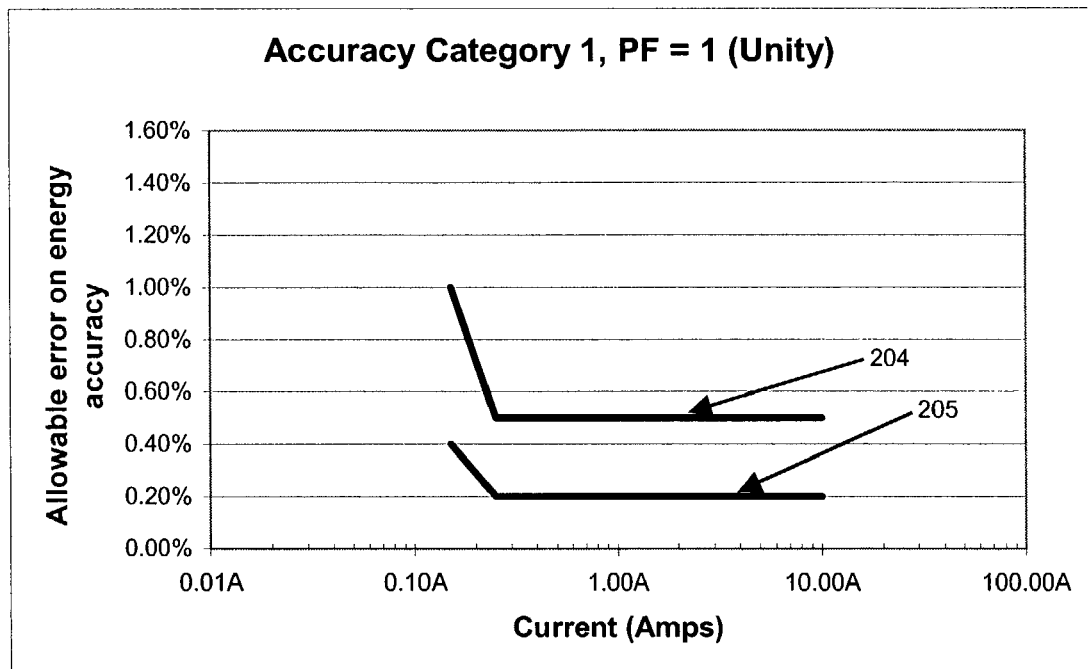
FIGS. 2a, 2b, 2c, and 2d are graphs and a chart showing allowable error in energy accuracy for one embodiment of accuracy category 1 at three different power factors.
Figure 2B:
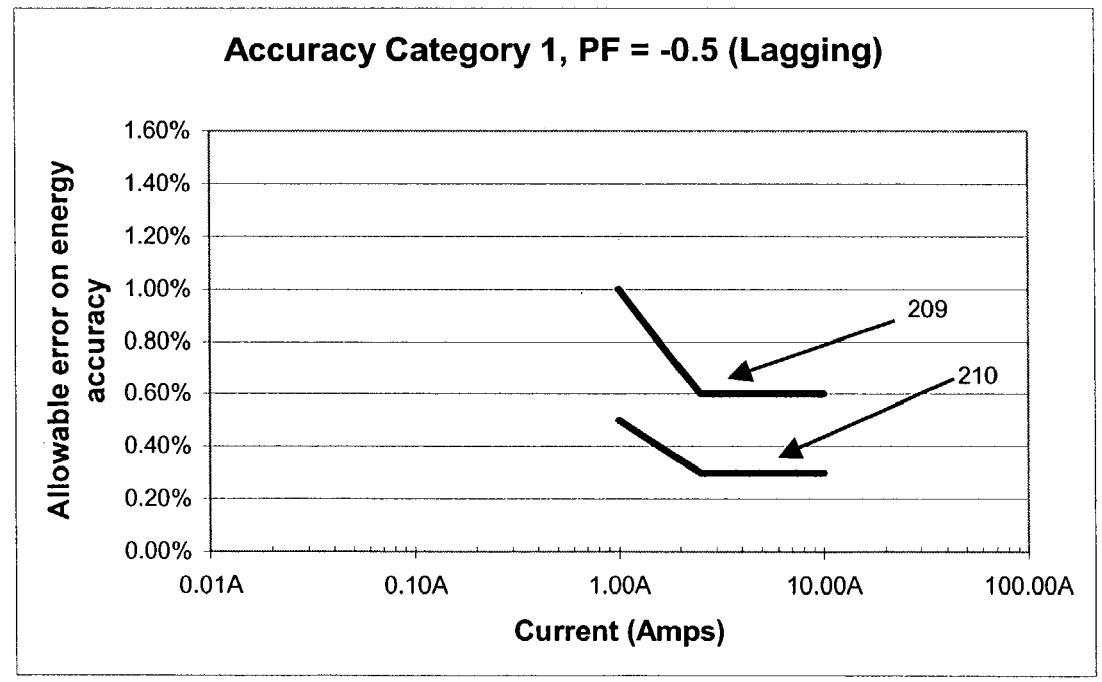
Figures 2C, 2D:
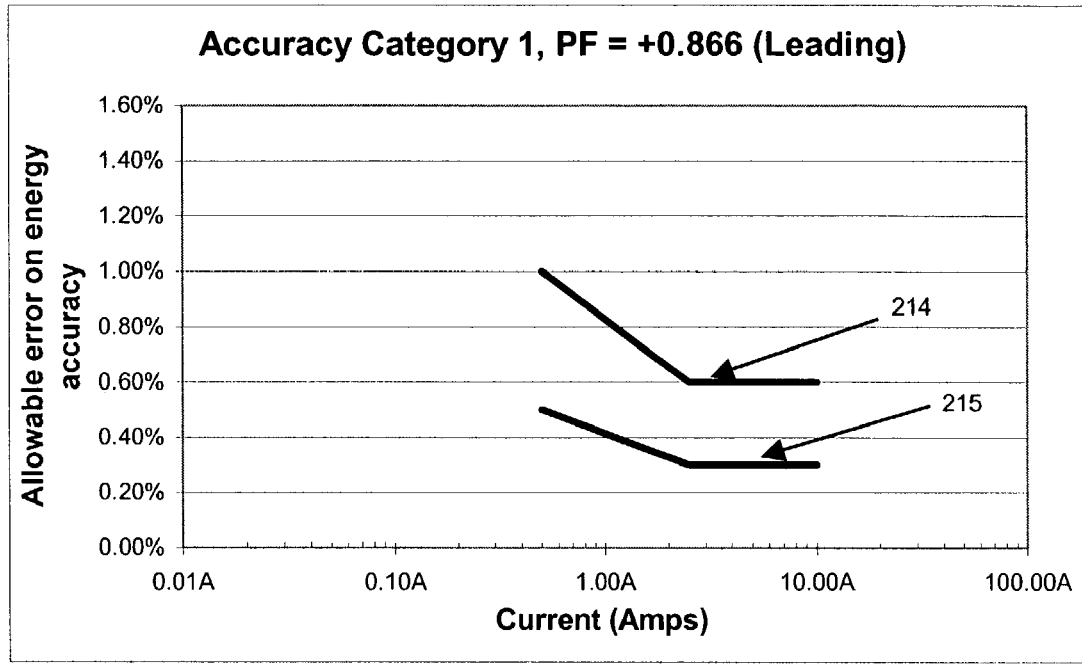

A preferred version of accuracy category 1 is shown in FIG. 2*a* with power factor at unity, in FIG. 2*b* with a lagging power factor 0.5, and in FIG. 2*c* with a leading power factor 0.866. An energy device that reliably meets or tests below curves 204, 209, and 214 and starts to register current at least at 10 mA is said to meet this accuracy category with accuracy class 0.5. An energy device that reliably meets or tests directly below curves 205, 210, and 215 and starts to register current at least at 10 mA is said to meet this accuracy category with accuracy class 0.2. FIG. 2*d* shows a preferred set of test criteria for accuracy category 1. In an alternate version of the accuracy category, an energy device meeting accuracy category 1 must comply with American National Standards Institute's ("ANSI") Standards for electric meters ANSI C12.20 (1998) at 10 amps nominal: American National Standard for Electricity Meters 0.2 and 0.5 Accuracy Classes, of which is known in the art, and which is herein incorporated by reference.

Figure 3A:
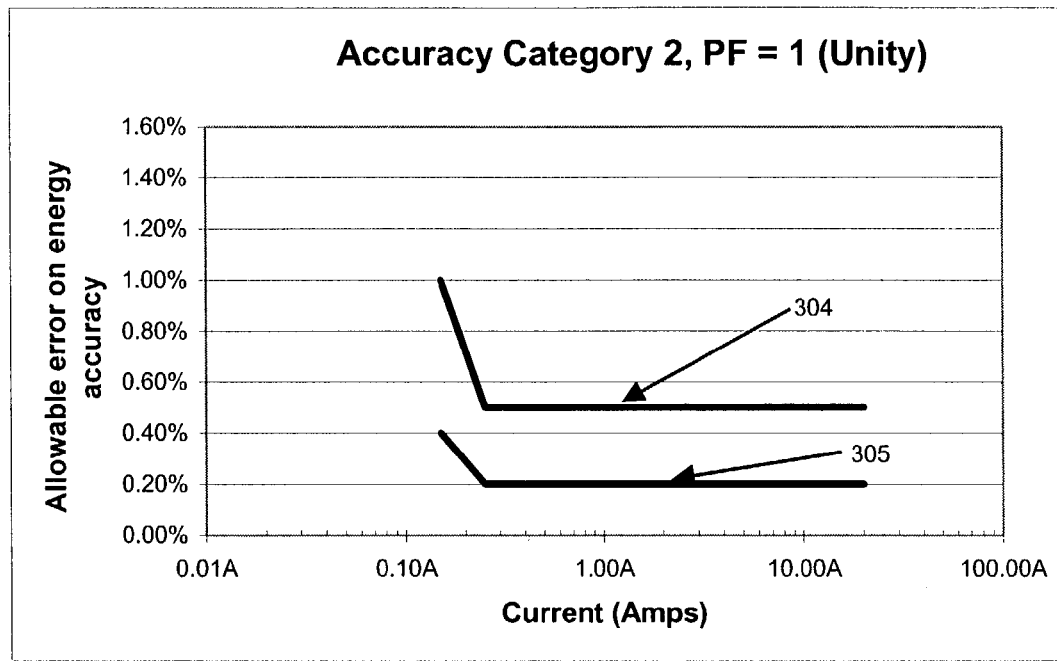
FIGS. 3a, 3b, 3c, and 3d are graphs and a chart showing allowable error in energy accuracy for one embodiment of accuracy category 2 at three different power factors.
Figure 3B:
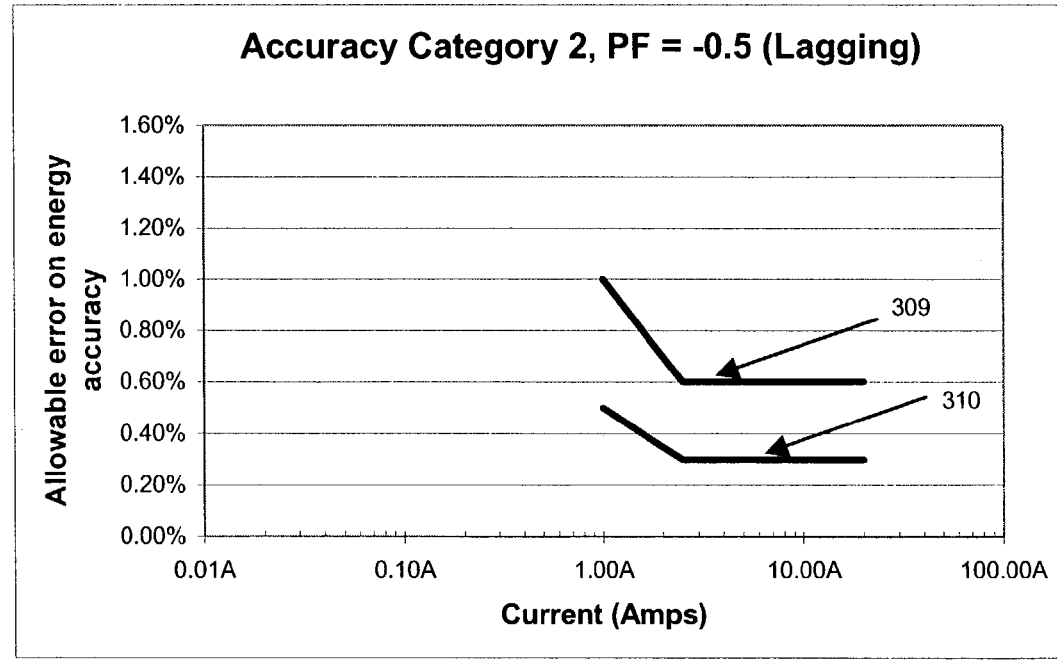
Figures 3C, 3D:
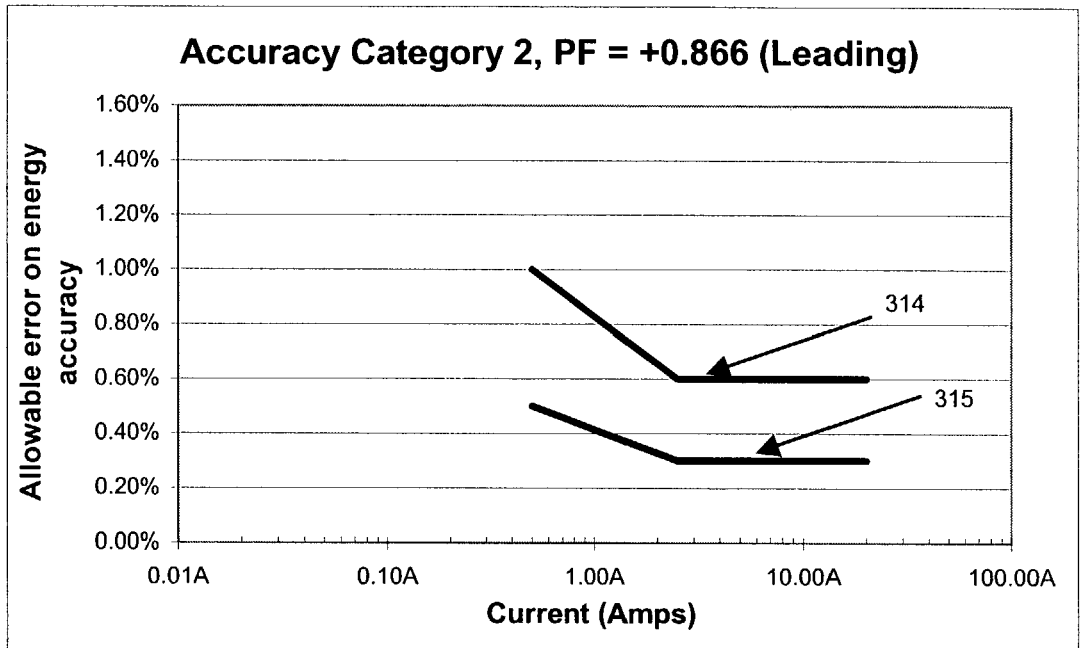

A preferred version of accuracy category 2 is shown in FIG. 3*a* with power factor at unity, in FIG. 3*b* with a lagging power factor 0.5, and in FIG. 3*c* with a leading power factor 0.866. An energy device that reliably meets or tests below curves 304, 309, and 314 and starts to register current at least at 10 mA is said to meet this accuracy category with accuracy class 0.5. An energy device that reliably meets or tests directly below curves 305, 310, and 315 and starts to register current at least at 10 mA is said to meet this accuracy category with accuracy class 0.2. FIG. 3*d* shows a preferred set of test criteria for accuracy category 2. In an alternate version of the accuracy category, an energy device meeting accuracy category 2 must comply with American National Standards Institute's ("ANSI") Standards for electric meters ANSI C12.20 (1998) at 20 amps nominal: American National Standard for Electricity Meters 0.2 and 0.5 Accuracy Classes, of which is known in the art, and which is herein incorporated by reference.

Figure 4A:
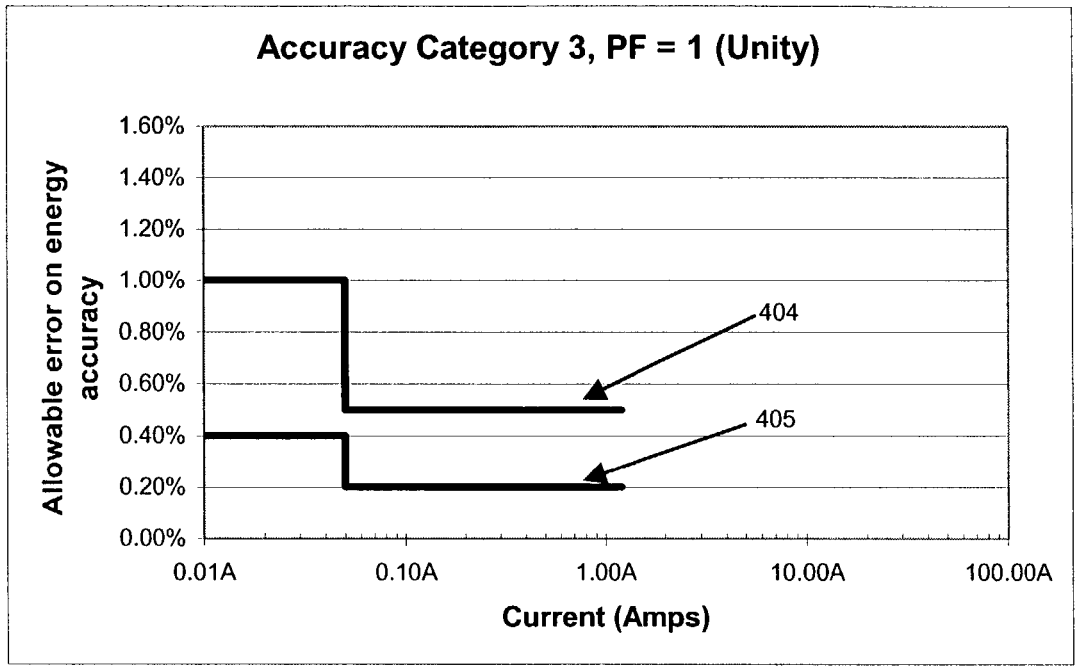
FIGS. 4a, 4b, 4c, and 4d are graphs and a chart showing allowable error in energy accuracy for one embodiment of accuracy category 3 at three different power factors.
Figure 4B:
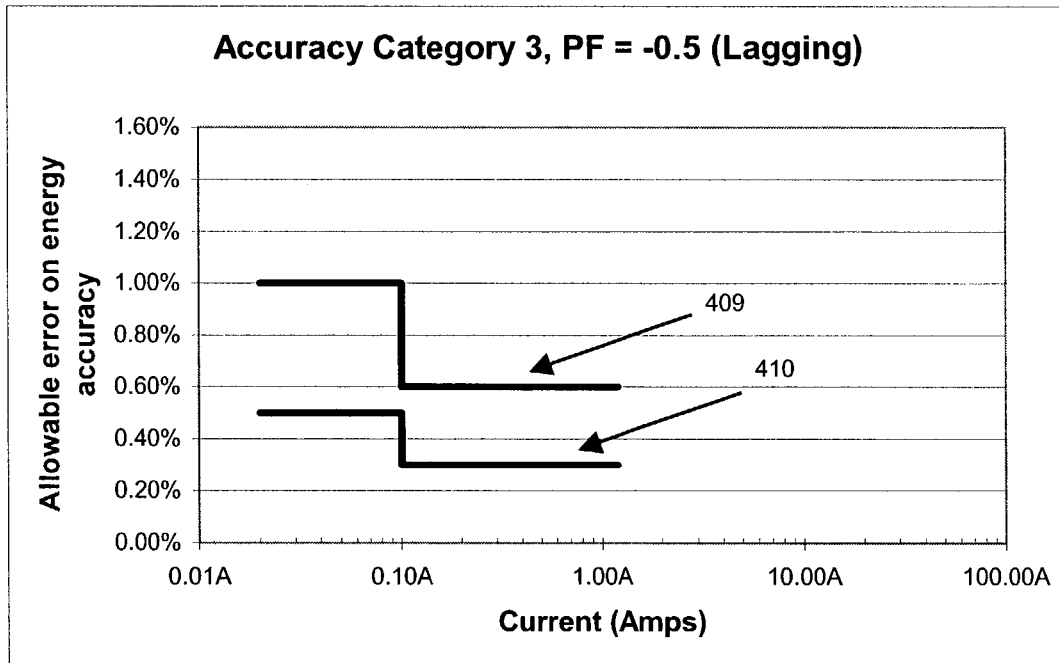
Figures 4C, 4D:
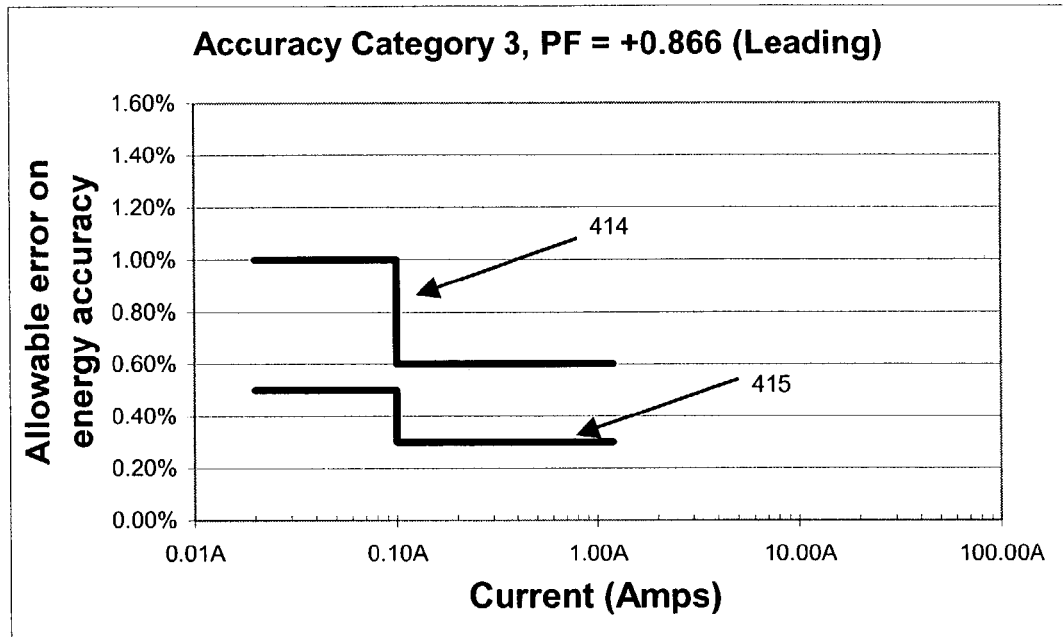

A preferred version of accuracy category 3 is shown in FIG. 4*a* with power factor at unity, in FIG. 4*b* with a lagging power factor 0.5, and in FIG. 4*c* with a leading power factor 0.866. An energy device that reliably meets or tests below curves 404, 409, and 414 and starts to register current at least at 1 mA is said to meet this accuracy category with accuracy class 0.5. An energy device that reliably meets or tests directly below curves 405, 410, and 415 and starts to register current at least at 1 mA is said to meet this accuracy category with accuracy class 0.2. FIG. 4*d* shows a preferred set of test criteria for accuracy category 3. In an alternate version of the accuracy category, an energy device meeting accuracy category 3 must comply with the International Engineering Consortium "IEC" 60687 0.2S, 1A nominal, of which is known in the art, and which is herein incorporated by reference.

Figure 5A:
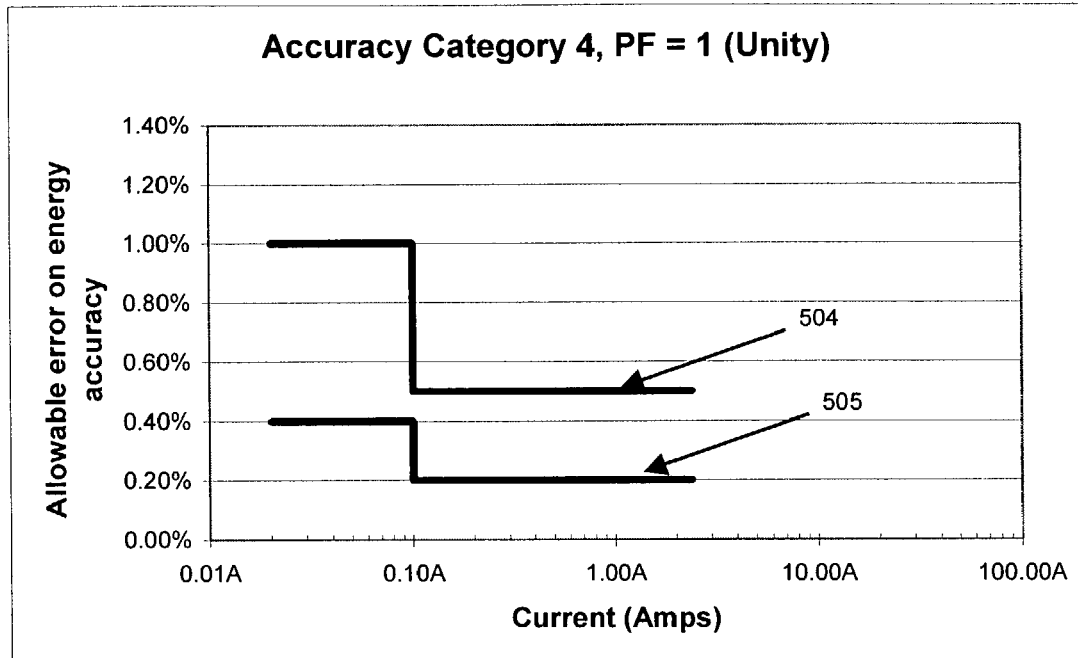
FIGS. 5a, 5b, 5c, and 5d are graphs and a chart showing allowable error in energy accuracy for one embodiment of accuracy category 4 at three different power factors.
Figure 5B:
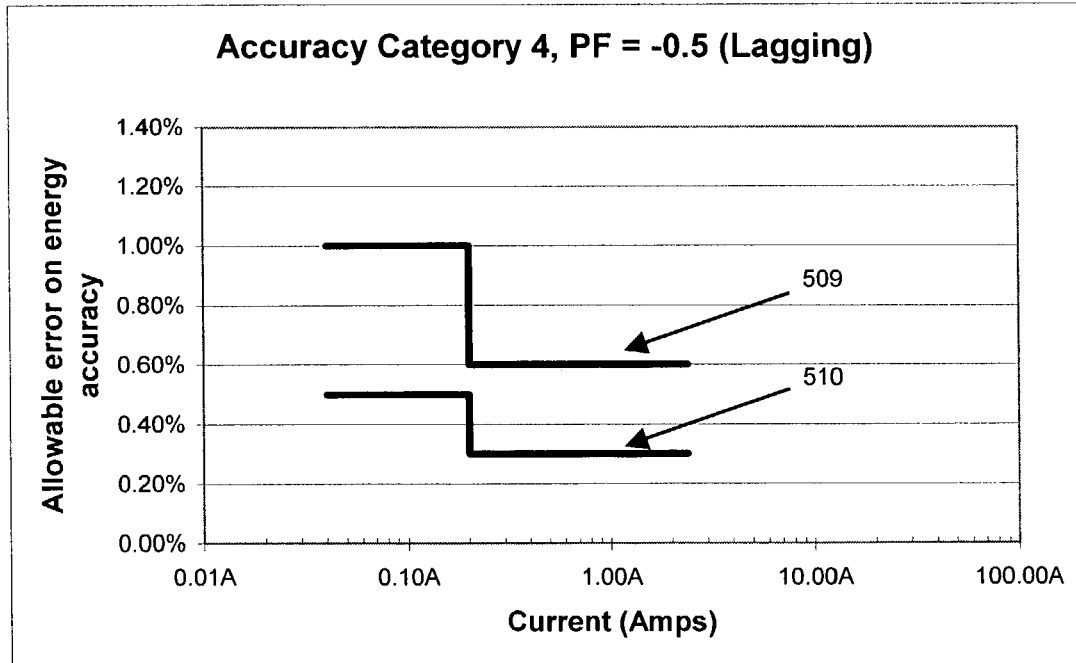
Figures 5C, 5D:
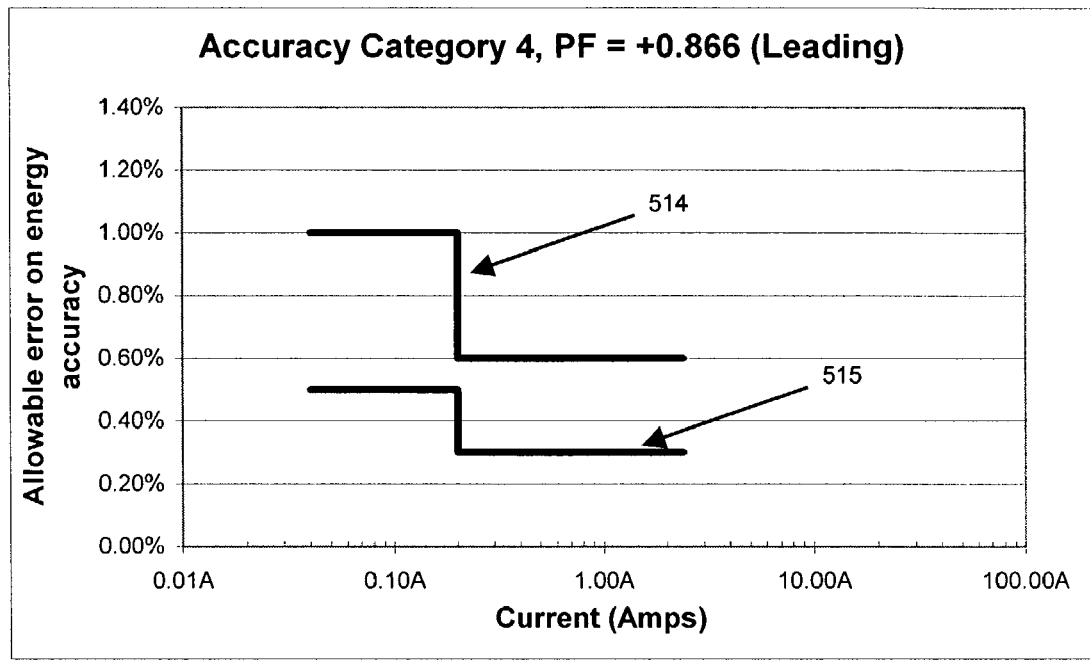

A preferred version of accuracy category 4 is shown in FIG. 5*a* with power factor at unity, in FIG. 5*b* with a lagging power factor 0.5, and in FIG. 5*c* with a leading power factor 0.866. An energy device that reliably meets or tests below curves 504, 509, and 514 and starts to register current at least at 2 mA is said to meet this accuracy category with accuracy class 0.5. An energy device that reliably meets or tests directly below curves 505, 510, and 515 and starts to register current at least at 2 mA is said to meet this accuracy category with accuracy class 0.2. FIG. 5*d* shows a preferred set of test criteria for accuracy category 4. In an alternate version of the accuracy category, an energy device meeting accuracy category 4 must comply with the International Engineering Consortium "IEC" 60687 0.2S, 2A nominal, of which is known in the art, and which is herein incorporated by reference.

Figure 6A:
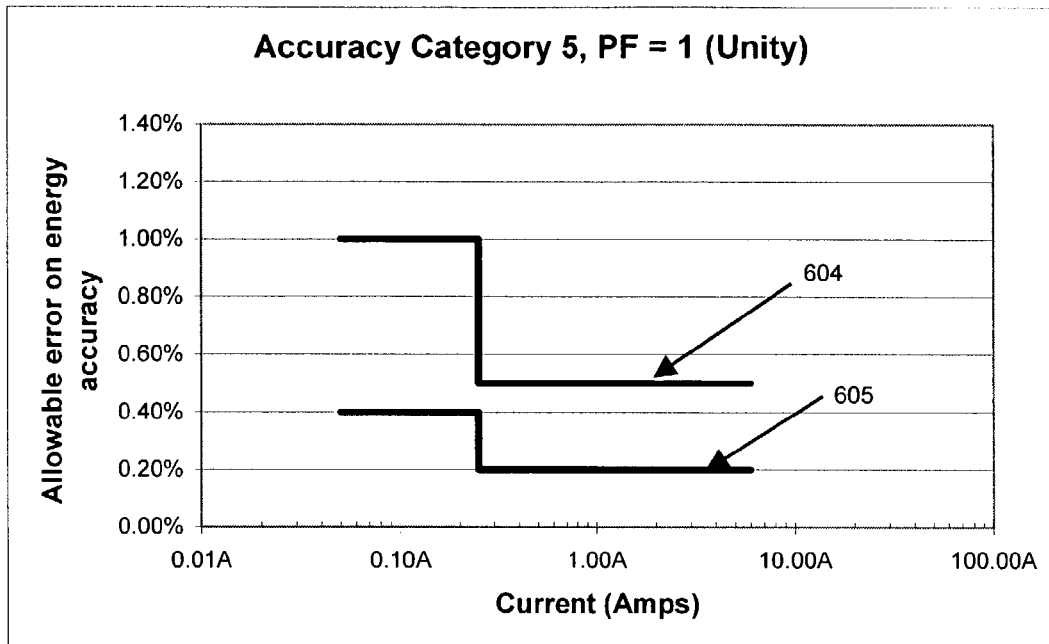
FIGS. 6a, 6b, 6c, and 6d are graphs and a chart showing allowable error in energy accuracy for one embodiment of accuracy category 5 at three different power factors.
Figure 6B:
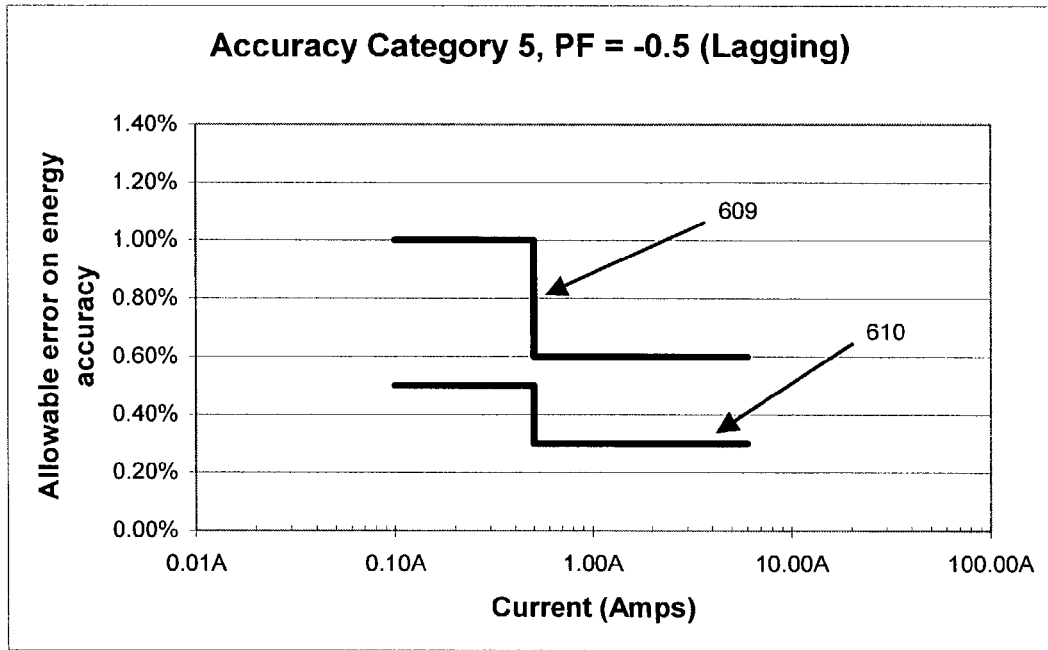
Figures 6C, 6D:
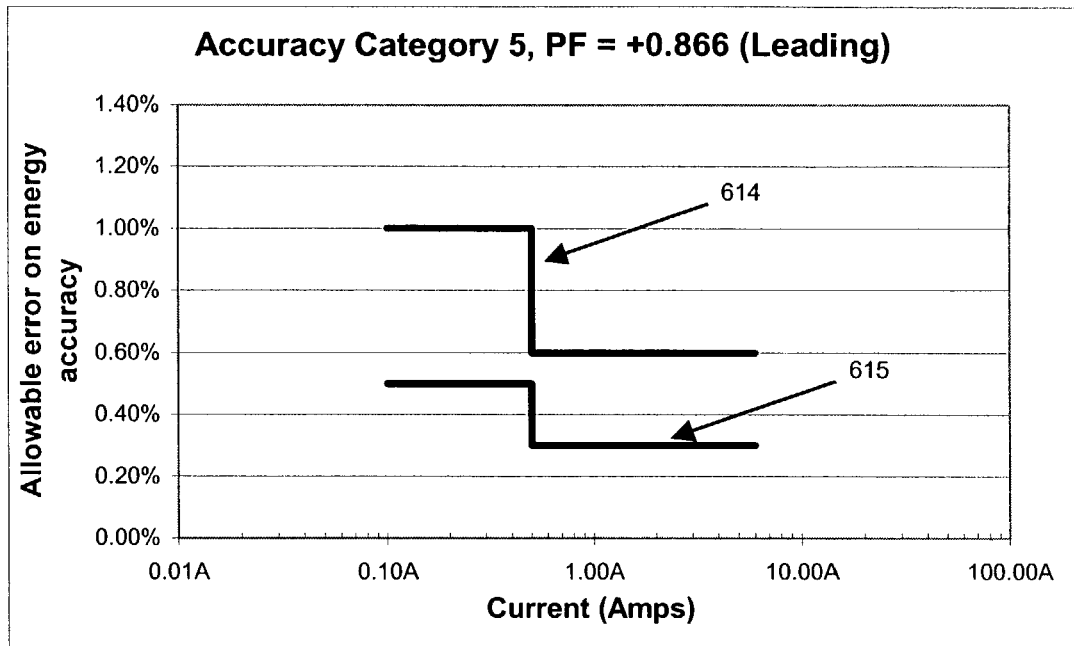

A preferred version of accuracy category 5 is shown in FIG. 6a with power factor at unity, in FIG. 6b with a lagging power factor 0.5, and in FIG. 6c with a leading power factor 0.866. An energy device that reliably meets or tests below curves 604, 609, and 614 and starts to register current at least at 5 mA is said to meet this accuracy category with accuracy class 0.5. An energy device that reliably meets or tests directly below curves 605, 610, and 615 and starts to register current at least at 5 mA is said to meet this accuracy category with accuracy class 0.2. FIG. 6d shows a preferred set of test criteria for accuracy category 5. In an alternate version of the accuracy category, an energy device meeting accuracy category 5 must comply with the International Engineering Consortium "IEC" 60687 0.2S, 5A nominal, of which is known in the art, and which is herein incorporated by reference.

A preferred embodiment of the energy device has specifications that meet or exceed accuracy categories 1, 2, 3, 4 and 5 simultaneously. FIGS. 7a, 7b, 7c, and 7d illustrate the required accuracy at an extended dynamic range required to meet the above accuracy categories 1, 2, 3, 4, and 5 within one device. Six accuracy category curves 704, 705, 709, 710, 714, and 715, indicate the minimum acceptable accuracy for the combined categories within the entire extended current range, which is 10 mA to 20 A in FIG. 7.

Figure 7A:
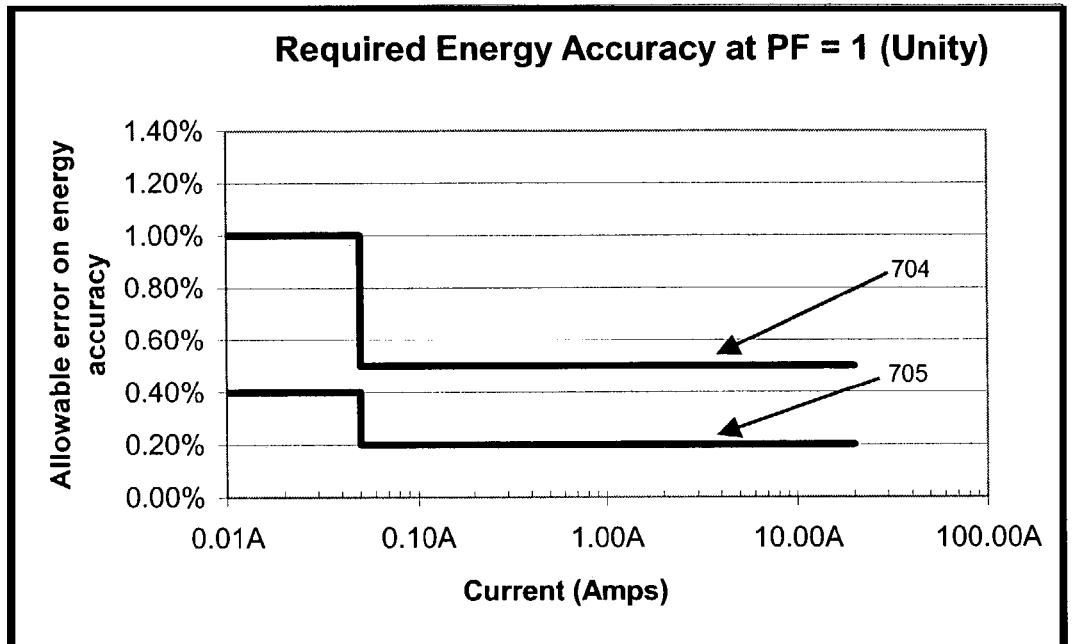
Figure 7B:
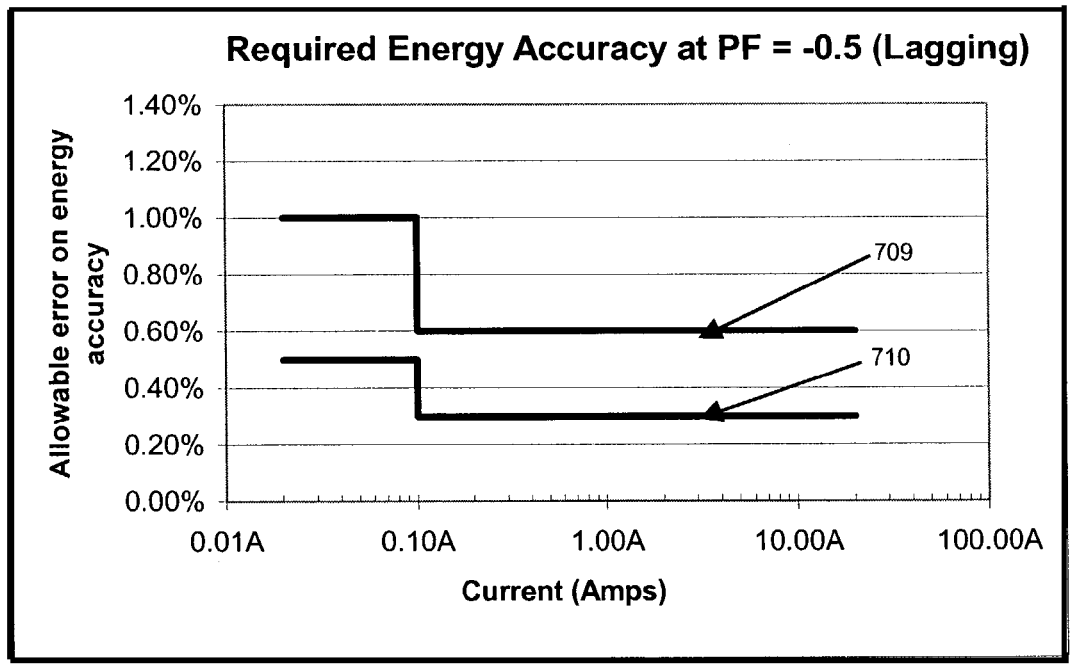
Figure 7C:
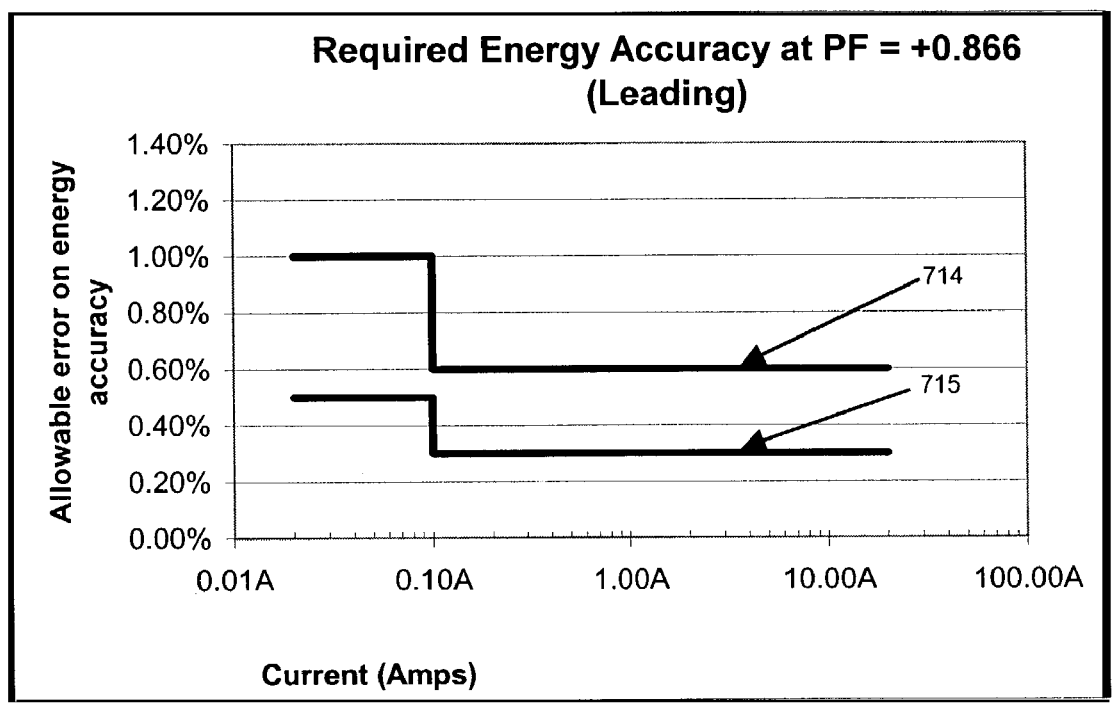

The accuracy criteria for this embodiment of the energy device are shown in FIG. 7a with power factor at unity, in FIG. 7b with a lagging power factor 0.5, and in FIG. 7c with a leading power factor 0.866. An energy device that reliably meets or tests below curves 704, 709, and 714 and starts to register current at least at 1 mA is said to meet the combined accuracy categories with accuracy class 0.5. An energy device that reliably meets or tests directly below curves 705, 710, and 715 and starts to register current at least at 1 mA is said to meet the combined categories with accuracy class 0.2.

FIG. 7d shows a preferred set of test criteria for the combined accuracy categories. In one alternate version of the combined accuracy categories, an energy device meeting the extended dynamic range must comply with (1) ANSI C12.20 (1998) at 10 amps nominal: American National Standard for Electricity Meters 0.2 and 0.5 Accuracy Classes, and with (2) ANSI Standards for electric meters ANSI C12.20 (1998) at 20 amps nominal: American National Standard for Electricity Meters 0.2 and 0.5 Accuracy Classes, and with (3) IEC 60687 0.2S, 1A nominal, and with (4) IEC 60687 0.2S, 2A nominal, and with (5) IEC 60687 0.2S, 5A nominal.

It can be appreciated that other ANSI, IEC or governmental standards known in the art may give a different allowable error as mentioned above, such as between 0.1% and 1.0%, and thus the accuracy category curves and extended dynamic range can be adjusted accordingly in other versions of the accuracy classes. It can also be appreciated that the device is preferably capable of receiving and sensing current in the range of 1 mA to about 24A. The extended dynamic range will be described in more detail below.

As an energy device is powered on, its meter accuracy will alter and come to a known steady state as it continues to operate. This is due to the circuitry and other associated device hardware warming to a known calibrated state. In one embodiment, the energy device operates within the acceptable extended dynamic range in both initial startup conditions, and steady state conditions. With the extended dynamic range, this embodiment of the energy device operates reliably and tests at an improved accuracy over a greater dynamic range as compared to a device that only meets the requirements of one accuracy class.

The extended dynamic range of the energy device provides the ability for the energy device to measure energy within an allowable error in accuracy over a range of current magnitude. In operation, meter manufactures calibrate their devices to operate within a specific range required by one or two specifications at required accuracy classes; the specifications chosen by the manufacturer are typically driven by obtaining the optimal accuracy over a specific current range. A preferred implementation of an IED takes into account accuracy and dynamic range of the current inputs. In addition, the IED uses a digital signal processor (DSP) and controlled gain switching technologies to further increase the accuracy achievable over an extended dynamic range. This digital signal processor (DSP) controlled gain switching technologies is described in more detail below. In an alternate embodiment, an energy device achieves an extended dynamic range utilizing a digital sensor capable of directly producing high resolution and low noise digital samples from the monitored current with an extended dynamic range. The term DSP hereafter preferably incorporates at least one microprocessor, digital signal processor, or microprocessor optimized for digital signal processing.

Figure 9:
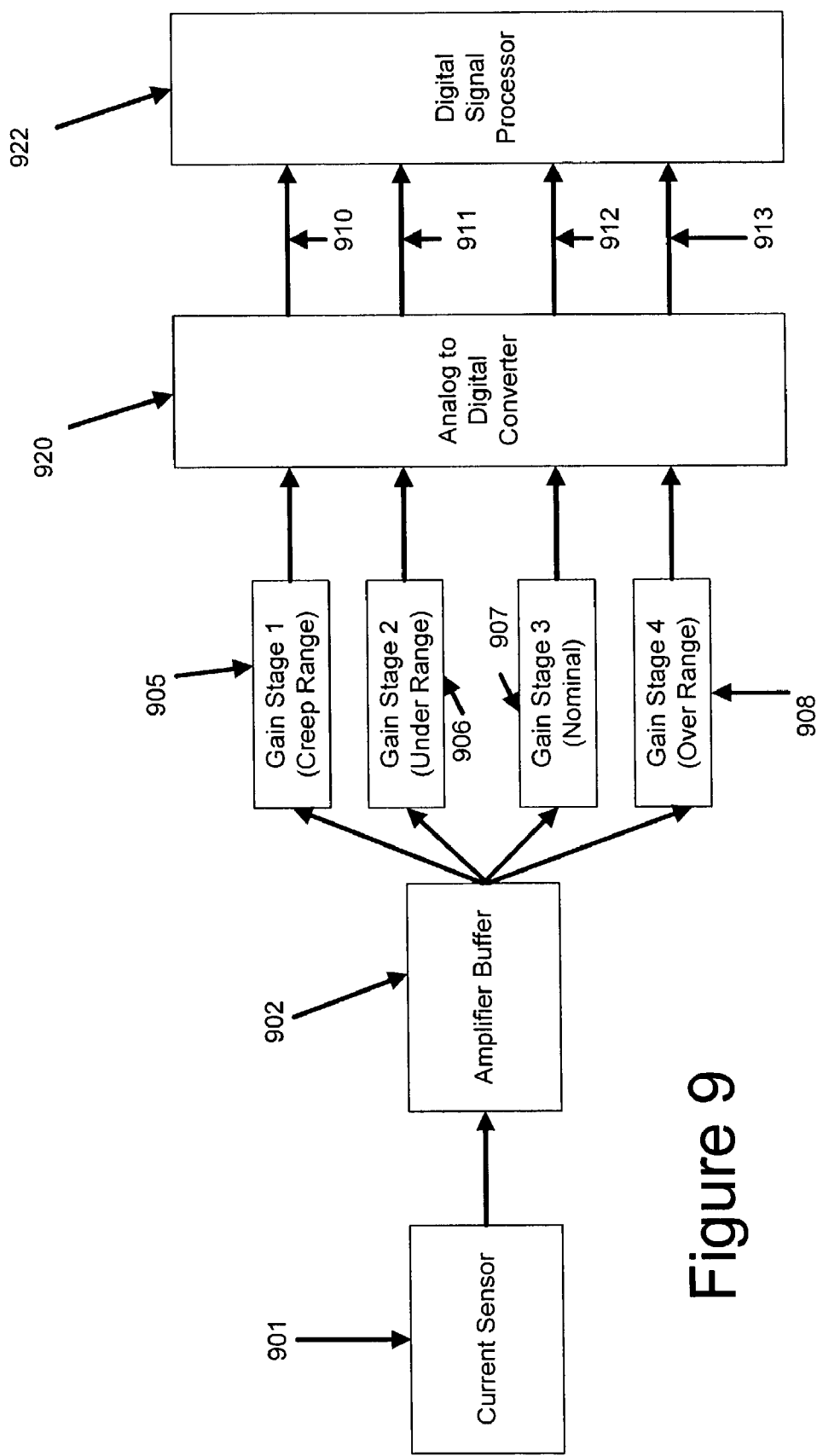
FIG. 9 is a block diagram of one embodiment of an intelligent electronic device with several gain stages configured to accommodate an extended range of current values.

FIG. 9 is a block diagram of an IED that uses DSP-controlled gain switching technology. The control is obtained by internally splitting the current input to the energy device into parallel gain channels that are scaled using separate amplifiers for each channel. In the illustrated embodiment, the current input is split into four channels. For the purposes of description, these four channels are hereto referred to as a creep gain channel, an under range gain channel, a nominal range channel, and an over range gain channel. It will be recognized by artisans knowledgeable in the field that the IED can alternatively be configured with fewer gain channels, to reduce cost where lower accuracy is acceptable, or more gain channels, where higher accuracy or larger dynamic range is desired.

The IED depicted in FIG. 9 includes a current sensor 901, an amplifier buffer 902, a creep-range gain stage 905 (gain stage 1), an under-range gain stage 906 (gain stage 2), a nominal gain stage 907 (gain stage 3), an over-range gain stage 908 (gain stage 4), an A/D converter 920, and a DSP 922. The current sensor 901 is configured to sense a current in a circuit that supplies or draws power from a remote location. This current sensor 901 generates an analog measurement signal indicative of the current in the circuit. The current sensor 901 is coupled to the amplifier buffer 902 and provides the measurement signal to the amplifier buffer 902. In turn, the amplifier buffer provides a buffered measurement signal to the four gain stages 905, 906, 907, and 908. The input of the amplifier buffer 902 is preferably configured to receive the measurement signal without impacting the operation of the current sensor. The output of the amplifier buffer 902 is preferably configured to provide a robust high-fidelity buffered version of the measurement signal to the gain stages 905, 906, 907, and 908. The amplifier buffer 902 can be further configured to introduce some amplification or conditioning to the measurement signal.

The gain stages 905-908 are amplification stages that linearly amplify the measurement signal. Depending on the configuration of further downstream components, such as A/D converter 920 and CPU 922, one or more of gain stages 905-908 can be configured in alternate embodiments of the IED to impart nonlinear amplification, such as logarithmic amplification.

The creep-range gain stage 905 is configured to provide an appropriate high amplification for low-amplitude measurement signals. The output of creep-range gain stage 905 is coupled to A/D converter 920; its high amplification is chosen so that low-amplitude measurement signals are amplified to span substantially the full range of input signals for A/D converter 920.

Similarly, the over-range gain stage 908 is configured to provide an appropriate low amplification for high-amplitude measurement signals. The output of over-range gain stage 908 is also coupled to A/D converter 920; its low amplification is chosen so that high-amplitude measurement signals are amplified only enough that they span substantially the full range of input signals for A/D converter 920.

For measurement signals with intermediate values, the under-range gain stage the nominal gain stage 907 provide appropriate intermediate levels of amplification. These two intermediate gain stages are also coupled to amplifier buffer 902 and A/D converter 920, and they amplify and convey the measurement signal therebetween.

The selection of the gain values for gain stages 905-908 depends on a variety of criteria. First, the creep-range gain stage 905 and the over-range gain stage 908 have gains that permit the minimum and maximum expected currents to be measurable. Second, the four gains are chosen in cooperation so that the outputs of the four gain stages span substantially the full input range of A/D converter 920 for four overlapping ranges of the measurement signal. Further, the individual gains are preferably chosen in view of (1) the resolution of the A/D converter 920 and (2) the required accuracy of the IED over the various ranges of the measurement signal. An illustration of selected gains and the resulting overlap is discussed below, with reference to FIGS. 8a-8c.

The A/D converter 920 in this embodiment of the IED is a 12-bit unit. The A/D converter simultaneously receives four versions of the buffered and amplified analog measurement signal from gain stages 905-908. These four analog signals are converted to four 12-bit digital signals. These digital signals are streams of digital samples that represent the current used in the calculation of the flow and quantity of energy.

In other embodiments of the IED, the resolution of the A/D converter 920 can be more or less than 12 bits. The number of bits can be chosen according to the needs of particular implementations. Higher-resolution A/D converters provide a greater resolution, but come at an increased cost. Lower-resolution A/D converters are less expensive, but can lead to an increased number of gain stages in order to span the dynamic range of sensed currents. As technology advances and costs change, the appropriate choice of A/D resolution under these considerations may also change.

The DSP 922 is coupled to the A/D converter 920 and receives the four digital signals from the A/D converter 920 and generates an output measurement in response to the digital signals. The DSP 922 is configured to switch among the four digital signals over time. As the current in the circuit being monitored changes, so will the digital signals being supplied to DSP 922. DSP 922 can switch as needed among the four signals to choose the one with the most dynamic range in the 12-bit representation. This switching ability allows DSP 922 to produce an output signal with an optimal resolution for the magnitude of the measurement signal. By thus optimizing the resolution (precision) of its output, DSP 922 can ensure that the accuracy of the output measurement is not limited by the precision of the output measurement.

To select the best digital signal among the 910-913, the DSP 922 scans the four digital signals, sample by sample, to identify and then preferably ignore any saturated channels. For a 12 bit A/D converter, a sample is saturated when the sample shows an A/D converter count of 4096. In one embodiment of the IED, a sample is considered to be saturated when the sample manifests an A/D converter count of 4090 to 4096. Artisans will appreciate, however, that other counts can be used as a saturation level. If any samples are saturated, the DSP 922 sets the gain selection information to select the digital signal from a gain stage that is not saturated (or, the least saturated, if all of the gain stages are saturated). This guarantees that the samples used are from the channel with the highest gain that exhibits the least amount of saturation. This provides the highest resolution of digital samples that represents the analog signal.

As further shown in FIG. 9, the gain stages 905, 906, 907, and 908 permanently connect, i.e., without mechanical switching, each gain channel signal to at least one A/D converter 920. The A/D converter 920 preferably samples the analog current and voltage in each phase for each gain channel of the electric circuit and converts the analog signal to a digital signal for each gain channel. Thus, information is gathered for all gain channel signals at all times, even if a gain channel signal is saturated, to guarantee no missing or clipped samples.

The IED in FIG. 9 uses an amplifier buffer and parallel gain stages to generate the four amplified signals, which are then digitized and provided to a DSP. One of skill in the art of electronics design would appreciate that the IED can be implemented in alternate configurations, such as, for example, a single chain of amplifiers connected in series, with the various gain-stage outputs being picked off after each amplifier in the series. The gain stages can also be user-adjustable, for applications in which a user wishes to have control over the accuracy profile of the IED's extended dynamic range.

Figure 8A:
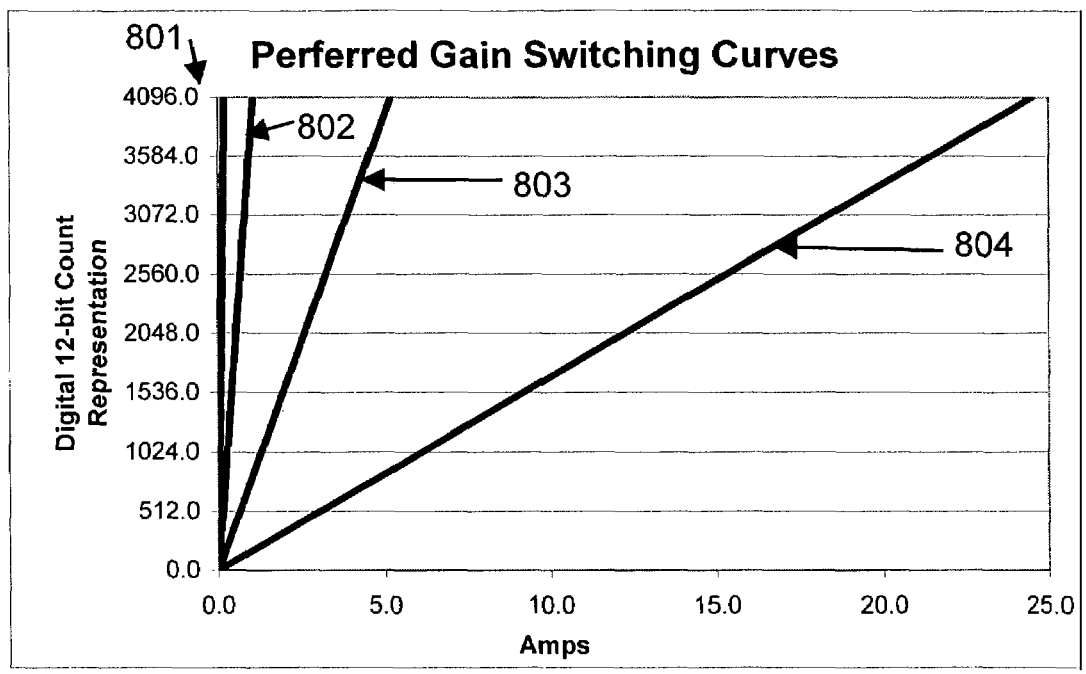
FIGS. 8a, 8b, and 8c are graphs of gain switching curves for one implementation of an energy metering device.

FIG. 8a is a linear-log plot of input peak current versus A/D converter count for one arrangement of the different gain channels. For a 12 bit A/D converter, an absolute value of the A/D converter count ranges from 0 to 4096. In the embodiment depicted by FIG. 8a, an IED has a creep gain channel that covers a current range of about 0 to 0.181 Amps RMS (0.26 Amps peak). This creep gain channel has a current-to-bits conversion shown by curve 801 in FIG. 8a. An under range gain channel encompasses about 0 to 1.062 Amps RMS (1.5 Amps peak). This under range channel has a current-to-bits conversion shown by curve 802 in FIG. 8a. A nominal gain channel is about 0 to 5.175 Amps RMS (7.3 Amps peak). This nominal gain channel has a current-to-bits conversion shown by curve 803 in FIG. 8a. An over range gain channel covers a current range of about 0 to 24.5 Amps RMS (34.6 Amps peak). This over range channel has a current-to-bits conversion shown by curve 804 in FIG. 8a.

Figure 8B:
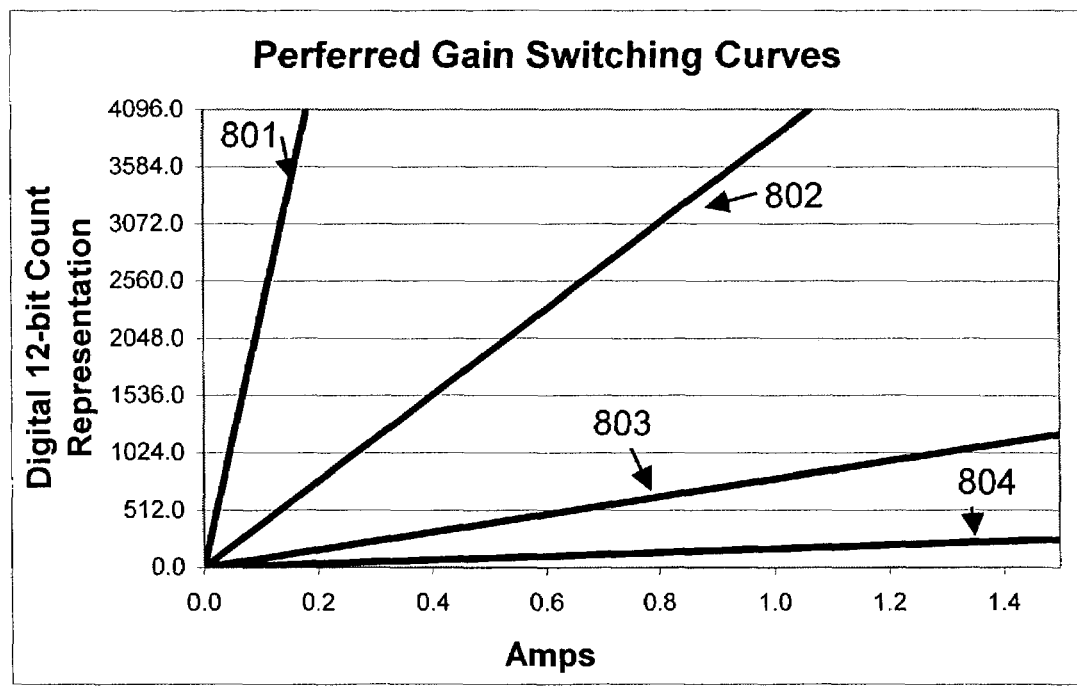

FIG. 8b is a linear-log plot with an expanded view of the low-current region of FIG. 8a. This expanded view illustrates the behavior of the creep and under range channels represented by curves 801 and 802.

Figure 8C:
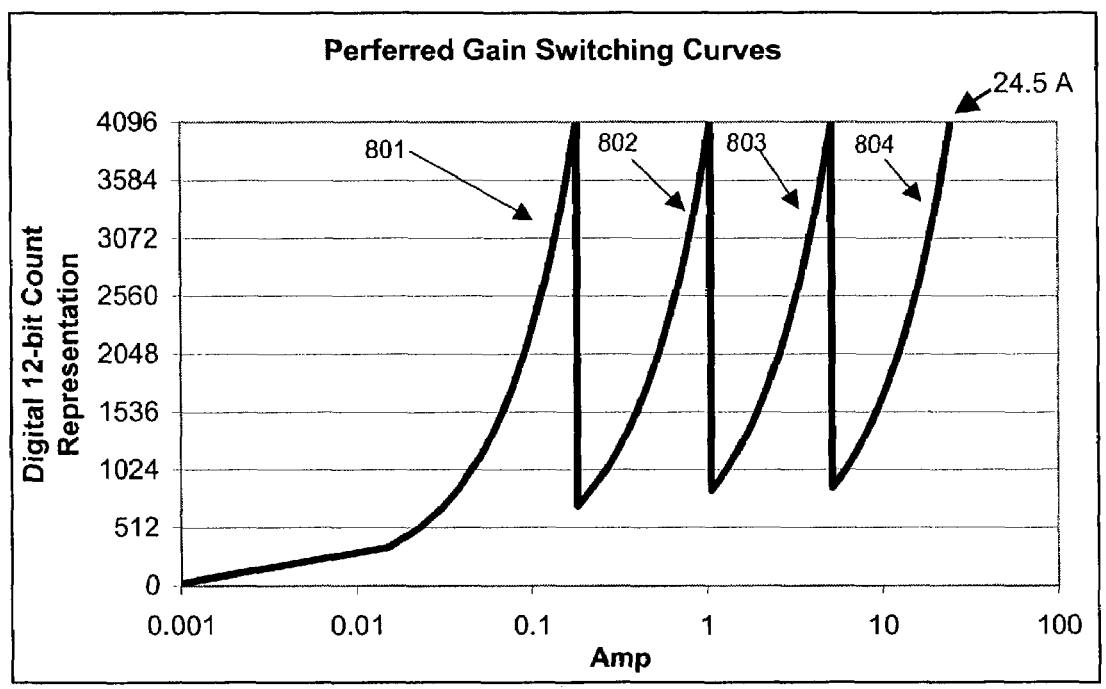

FIG. 8c also shows the current-to-bits conversions made by each of the four channels. FIG. 8c is a linear-linear plot of the four conversions from FIGS. 8a and 8b, and it further shows the switching points that can be chosen by a DSP of the IED from FIG. 9. Artisans will appreciate that these current ranges and channels are implementation dependent and that other current ranges are possible. In addition, it should be appreciated that switch points can vary from unit to unit due to tolerances in the electronic circuitry. The switch points are preferably chosen in view of the ranges of desired overlapping accuracy standards. Further, the switch points may additionally be dependent on the direction in which the current is changing, thereby allowing for hysteresis. These variations, however, do not adversely affect the overall gain switching technology and its effect on the overall accuracy and extended dynamic range of an IED.

One of the preferred embodiments of an energy device achieves an extended dynamic range using numerous gain stages, with carefully designed switch points so that the required energy accuracy is met over the extended dynamic range. The energy device is preferably able to measure energy within 0.4% allowable error in accuracy over an extended dynamic range of at least 67 db (>2000× in detected current) and 0.2% allowable error in accuracy over an extended dynamic range of at least 53 db (>800× in detected current).

In one alternate embodiment, the energy device achieves the extended dynamic range by using a digital sensor capable of directly producing high resolution and low noise digital samples from the monitored current with an extended dynamic range. The digital sensor can be configured to produce digital samples that are proportional to the monitored current. Alternatively, the digital sensor can be configured to generate a nonlinear representation, for example, a logarithmic representation, of the monitored current.

In general, designing an extended dynamic range in an energy device using either numerous gain stages or digital sensors is more cost effective, easier to mass produce, and simpler to design than an energy device utilizes an A/D converter with a high bit count to handle a wide range of voltage and current. This is due to the fact that many-bit (16 bit or higher) A/D converters required are comparatively expensive. In addition, the overall system design with many-bit A/D converters becomes more complex and more costly due to signal/noise issues, data processing issues, and calibration issues. At the bottom end of the bit range, the signal/noise ratio decreases, especially in industrial applications, to produce poor quality, low accuracy signals.

Cogeneration clients are typically energy consumers; however, as these clients have the ability to generate power, occasionally they supply power to the grid based on choice, contract, need, or price per kW. Independent power providers (IPP) are facilities that generate and provide power to the grid; however, when the IPP facility generation facility is not energized and the IPP is not providing power, there is a small amount of power that is being consumed at the facility. Current flowing in or out of a cogeneration plant or an IPP can have a very large range. It is important to accurately measure all energy that is being delivered or received at these plants regardless of whether the current flow is in the milliamps or in the amps. Typically energy flow is measured with as least two or more prior-art meters to cover the required current range. Cogeneration clients may find it particularly advantageous to use instead only one meter and one set of installation hardware to be able to accurately monitor the energy with an allowable error in accuracy.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. An energy device for measuring the delivery and generation of electrical energy from an energy supplier to a shared energy grid through an electric circuit, the energy device comprising:

a sensor configured to sense a current or a voltage of the electric circuit and configured to generate digital samples indicative of the current or voltage;

a microprocessor coupled with the sensor, configured to receive the digital samples, and configured to generate a measurement signal in response to the samples;

wherein the measurement signal is indicative of energy through the electric circuit to within an accuracy of 1.0% allowable error in energy over a 10 mA to 20 A current with a power factor near unity; and wherein the sensor and the microprocessor are further configured so that the measurement signal generated therefrom satisfies each of at least four accuracy categories, wherein each of the at least four accuracy categories are operable to satisfy at least one standard and cover the dynamic range of 10 mA to 20 A.

2. The energy device of claim 1, wherein the sensor comprises:

an analog sensor configured to generate an analog signal indicative of the current; and an analog to digital converter coupled with the sensor and operative to generate the digital samples in response to the analog signal.

3. The energy device of claim 1, wherein the sensor comprises a digital sensor configured to directly generate the digital samples indicative of the current.

4. The energy device of claim 1, wherein the measurement signal is further indicative of energy delivered through the electric circuit to within an accuracy of 0.2% allowable error in energy.

5. The energy device of claim 1, wherein the measurement signal is further indicative of energy delivered through the electric circuit to within an accuracy of 0.1% allowable error in energy.

6. The energy device of claim 1, wherein the sensor and the microprocessor are further configured so that the measurement signal generated therefrom satisfies five accuracy categories, wherein the five accuracy categories are defined over five current ranges: 10 mA to 1.0 A, 20 mA to 2.0 A, 50 mA to 5.0 A, 150 mA to 10 A, and 150 mA to 20 A.

7. The energy device of claim 1, wherein the at least four accuracy categories are defined over four current ranges: 10 mA to 1.0 A, 20 mA to 2.0 A, 50 mA to 5.0 A, and 150 mA to 10 A.

8. The energy device of claim 1, wherein the at least four accuracy categories are defined over four current ranges: 20 mA to 2.0 A, 50 mA to 5.0 A, 150 mA to 10 A, and 150 mA to 20 A.

9. The energy device of claim 1, wherein the four accuracy categories are IEC 60687 2A 0.5S, IEC 60687 5A 0.5S, ANSI C12.20 (1998) Class 10.5, and ANSI (1998) C12.20 Class 20 0.5.

10. The energy device of claim 1, wherein the four accuracy classes are IEC 60687 2A 0.2S, IEC 60687 5A 0.2S, ANSI C12.20 (1998) Class 10 0.2, and ANSI C12.20 (1998) Class 20 0.2.

11. The energy device of claim 1, wherein the range in current includes the range 10 mA to 20 A.

12. The energy device of claim 1, wherein the range in current includes the range 100 mA to 200 A.

13. The energy device of claim 1, wherein the energy device is a relay.

14. The energy device of claim 1, wherein the energy device is an electrical meter used for revenue settlement of energy transfer on the electric circuit.

15. The energy device of claim 1, wherein the measurement signal is further indicative of energy delivered through the electric circuit to within an accuracy of 0.6% allowable error in energy with a lagging power factor of approximately 0.5.

16. The energy device of claim 1, wherein the measurement signal is further indicative of energy delivered through the electric circuit to within an accuracy of 0.6% allowable error in energy with a leading power factor of approximately 0.866.

17. The energy device of claim 1 being further operative to generate the measurement signal for values of the current as low as 1 mA at 1.0% allowable error in energy; and
further wherein the energy device is operative to generate the measurement signal for values of the current as high as 24 A at 1.0% allowable error in energy.

18. The energy device of claim 1, wherein the measurement signal is further configured to be indicative of energy through the electric circuit to within an accuracy of 0.5% allowable error in energy over 10 mA to 20 A current.

19. The energy device of claim 1, wherein the measurement signal is further configured to be indicative of energy through the electric circuit to within an accuracy of 0.2% allowable error in energy over 10 mA to 20 A current.

20. An energy device for measuring the delivery and generation of electrical energy from an energy supplier to a shared energy grid through an electric circuit, the energy device comprising:
a sensor coupled with the electric circuit, operative to sense a current in the electric circuit, and operative to generate a signal indicative of the current; and
an output interface coupled to the sensor and configured to provide an energy measurement in response to the signal indicative of the current;
wherein the sensor and the output interface are operable in at least four accuracy categories, the four accuracy categories defining an extended dynamic range; and
further wherein the energy device is operative to provide the energy measurement when the current is between 10 mA to 20 A within 1.0% allowable error in energy.

21. The energy device of claim 20, wherein the energy supplier is an independent power provider.

22. The energy device of claim 20, wherein energy supplier is a cogeneration facility.

23. The energy device of claim 20, wherein the at least four accuracy categories are defined over at least four of these current ranges: 10 mA to 1 A, 20 mA to 2 A, 50 mA to 5 A, 15 mA to 2 A, 150 mA to 10 A and 150 mA to 20 A.

24. The energy device of claim 20, wherein the energy device is further operative to measure energy through the electric circuit to within an accuracy of 0.5% allowable error in energy over a current range of 10 mA to 20 A.

25. The energy device of claim 20, wherein the energy device is further operative to measure energy through the electric circuit to within an accuracy of 0.2% allowable error in energy over a current range of 10 mA to 20 A.

26. The energy device of claim 20, wherein the at least four accuracy categories are IEC 60687 1A 0.5S, IEC 60687 2A 0.5S, IEC 60687 5A 0.5S, ANSI C12.20 (2002) Class 2 0.5, ANSI C12.20 (1998) Class 10 0.5, and ANSI C12.20 (1998) Class 20 0.5.

27. The energy device of claim 20, wherein the four accuracy categories are IEC 60687 1A 0.2S, IEC 60687 1A 0.2S, IEC 60687 5A 0.2S, ANSI C12.20 (2002) Class 2 0.2, ANSI C12.20 (1998) Class 10 0.2, and ANSI C12.20 (1998) Class 20 0.2.

28. An energy monitoring device comprising:
a current sensor adapted to measure a current in a power delivery circuit and to generate a digital sensor signal indicative of energy in the power delivery circuit;
wherein the current sensor is configured to generate the digital sensor signal with an accuracy of:
0.5% allowable error in energy for values of the current from 50 mA to 20 A with a power factor of about unity, and
1.0% allowable error in energy for values of the current from 2 mA to about 50 mA with a power factor of about unity;
wherein the current sensor is operative to satisfy a plurality of accuracy categories.

29. The energy monitoring device of claim 28, wherein the current sensor is further configured to generate the digital sensor signal with an accuracy of:
0.2% allowable error in energy for values of the current from 50 mA to 20 A with a power factor of about unity; and
0.4% allowable error in energy for values of the current from 10 mA to about 50 mA with a power factor of about unity.

30. The energy monitoring device of claim 28, wherein the current sensor is further configured to generate the digital sensor signal with an accuracy of:
0.3% allowable error in energy for values of the current from 100 mA to 20 A with a lagging power factor of about 0.5; and
0.5% allowable error in energy for values of the current from 20 mA to 100 mA with a lagging power factor of about 0.5.

31. The energy monitoring device of claim 28, wherein the current sensor is further configured to generate the digital sensor signal with an accuracy of:
0.3% allowable error in energy for values of the current from 100 mA to 20 A with a leading power factor of about 0.866; and
0.5% allowable error in energy for values of the current from 20 mA to 100 mA with a leading power factor of about 0.866.

32. The energy monitoring device of claim 28, wherein the current sensor is further configured to generate the digital sensor signal with an accuracy of:
0.6% allowable error in energy for values of the current from 100 mA to 20 A with a lagging power factor of about 0.5; and
1.0% allowable error in energy for values of the current from 20 mA to 100 mA with a lagging power factor of about 0.5.

33. The energy monitoring device of claim 28, wherein the current sensor is further configured to generate the digital sensor signal with an accuracy of:
0.6% allowable error in energy for values of the current from 100 mA to 20 A with a leading power factor of about 0.866; and
1.0% allowable error in energy for values of the current from 20 mA to 100 mA with a leading power factor of about 0.866.

34. An energy monitoring device comprising:
a current sensor adapted to measure a current in a power delivery circuit and to generate an analog sensor signal indicative of the current;
wherein the current sensor is adapted to sense the current over a plurality of N current ranges, wherein N is an integer greater than one;
an analog-to-digital converter, wherein the analog-to-digital converter has an input range for analog inputs;
a plurality of X amplification circuits, wherein X is an integer greater than one, further wherein each amplification circuit is coupled to the current sensor and to the analog-to-digital converter;
wherein in response to the analog sensor signal, each amplification circuit is configured to generate a separate amplified signal, the X amplification circuits thereby generating X amplified signals;
wherein each of the X amplified signals substantially spans the input range of the analog-to-digital converter for a separate one of the N current ranges;
wherein the analog-to-digital converter is configured to receive the amplified signals and to generate digital samples in response to the amplified signals;
wherein the current sensor, the analog-to-digital converter, and at least one of the amplification circuits are operative in combination to generate the digital samples for values of the current as low as 2 mA at 1.0% allowable error in energy;
wherein the current sensor, the analog-to-digital converter, and at least one of the amplification circuits are operative in combination to generate the digital samples for values of the current as high as 20 A at 0.5% allowable error in energy; and
a selector circuit coupled to the analog-to-digital converter, wherein the selector circuit is adapted to select digital samples based on a selected one of the X amplified signals when the analog sensor signal is in a corresponding one of the N current ranges.

35. The energy monitoring device of claim 34, wherein the digital samples are indicative of energy through the electric circuit to within an accuracy of 0.5% allowable error in energy over 10 mA to 20 A in the current with a power factor near unity.

36. The energy monitoring device of claim 34, wherein the plurality of current ranges includes values from about 1 mA to about 24 A.

37. The energy monitoring device of claim 34, wherein the plurality of current ranges includes:

a first range from about 10 mA to about 1 A;
a second range from about 20 mA to about 2.0 A;
a third range from about 50 mA to about 5.0 A;
a fourth range from about 15 mA to about 2.0 A;
a fifth range from about 150 mA to about 10 A; and,
a sixth range from about 150 mA to about 20 A.

38. The energy monitoring device of claim 34, wherein the current sensor, the analog-to-digital converter, and the amplification circuits are configured so that the digital samples include measurements indicative of energy in the power delivery circuit with:
0.5% allowable error in energy for values of the current from 50 mA to 20 A; and
1.0% allowable error in energy for values of the current from 10 mA to about 50 mA.

39. The energy monitoring device of claim 34, wherein the current sensor, the analog-to-digital converter, and the amplification circuits are configured so that the digital samples include measurements indicative of energy in the power delivery circuit with:
0.2% allowable error in energy for values of the current from 50 mA to 20 A; and
0.4% allowable error in energy for values of the current from 10 mA to about 50 mA.

40. The energy monitoring device of claim 34, wherein the current sensor, the analog-to-digital converter, and the amplification circuits are configured so that the digital samples include measurements indicative of energy in the power delivery circuit, with a lagging power factor of about 0.5 or a leading power factor of about 0.866, and with:
0.3% allowable error in energy for values of the current from 100 mA to 20 A; and
0.5% allowable error in energy for values of the current from 20 mA to about 100 mA.

41. The energy monitoring device of claim 34, wherein the current sensor, the analog-to-digital converter, and the amplification circuits are configured so that the digital samples include measurements indicative of energy in the power delivery circuit, with a lagging power factor of about 0.5 or a leading power factor of about 0.866, and with:
0.6% allowable error in energy for values of the current from 100 mA to 20 A; and
1.0% allowable error in energy for values of the current from 20 mA to about 100 mA.

* * * * *

UNITED STATES PATENT AND TRADEMARK OFFICE
CERTIFICATE OF CORRECTION

| | | |
|---|---|---|
| PATENT NO. | : 7,336,065 B1 | Page 1 of 1 |
| APPLICATION NO. | : 10/341079 | |
| DATED | : February 26, 2008 | |
| INVENTOR(S) | : Geoffrey T. Hyatt et al. | |

It is certified that error appears in the above-identified patent and that said Letters Patent is hereby corrected as shown below:

On the Title Page

In column 2, line 8, under "ABSTRACT", after "the sensor. In" delete "a".

In the Claims

Column 12, in claim 9, line 3, after "(1998) Class" delete "10.5" and substitute --10 0.5-- in its place.

Signed and Sealed this

Twenty-ninth Day of July, 2008

JON W. DUDAS
*Director of the United States Patent and Trademark Office*